(12) United States Patent
Tomita et al.

(10) Patent No.: US 9,666,622 B2
(45) Date of Patent: May 30, 2017

(54) SEMICONDUCTOR INTEGRATED CIRCUIT DEVICE

(71) Applicant: Renesas Electronics Corporation, Koutou-ku, Tokyo (JP)

(72) Inventors: Kazuo Tomita, Tokyo (JP); Takeshi Kawamura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/228,622

(22) Filed: Aug. 4, 2016

(65) Prior Publication Data

US 2016/0343758 A1    Nov. 24, 2016

Related U.S. Application Data

(60) Division of application No. 14/840,707, filed on Aug. 31, 2015, now Pat. No. 9,437,643, which is a
(Continued)

(30) Foreign Application Priority Data

Jun. 26, 2013   (JP) ................................. 2013-133469

(51) Int. Cl.
    *H01L 31/18*    (2006.01)
    *H01L 27/146*   (2006.01)
    (Continued)

(52) U.S. Cl.
    CPC ........ *H01L 27/14625* (2013.01); *G02B 6/122* (2013.01); *G02B 6/4295* (2013.01);
    (Continued)

(58) Field of Classification Search
    None
    See application file for complete search history.

(56) References Cited

U.S. PATENT DOCUMENTS

| 8,633,559 B2 | 1/2014 | Wano et al. |
| 8,759,933 B2 | 6/2014 | Toumiya et al. |

(Continued)

FOREIGN PATENT DOCUMENTS

| JP | 2006-128383 A | 5/2006 |
| JP | 2007-305690 A | 11/2007 |

(Continued)

OTHER PUBLICATIONS

Office Action issued Nov. 17, 2016, in Japanese Patent Application No. 2013-133469.

*Primary Examiner* — Thao P Le
(74) *Attorney, Agent, or Firm* — Shapiro, Gabor and Rosenberger, PLLC

(57) ABSTRACT

Provided is a semiconductor integrated circuit device having pixel regions in a photodiode array region and having, in each of the pixel regions, a waveguide holding hole having a substantially perpendicular sidewall above the photodiode and embedded with a silicon oxide-based sidewall insulating film reaching the bottom surface of the hole and two or more silicon nitride-based insulating films having a higher refractive index on the inner side of the hole. This structure makes it possible to prevent deterioration of pixel characteristics of an imaging device, such as CMOS sensor, which is rapidly decreasing in size.

14 Claims, 31 Drawing Sheets

Related U.S. Application Data continuation of application No. 14/304,947, filed on Jun. 15, 2014, now Pat. No. 9,142,578.

(51) Int. Cl.
  *G02B 6/122* (2006.01)
  *G02B 6/42* (2006.01)
  *G02B 6/12* (2006.01)

(52) U.S. Cl.
  CPC .... *H01L 27/1462* (2013.01); *H01L 27/14603* (2013.01); *H01L 27/14609* (2013.01); *H01L 27/14643* (2013.01); *H01L 27/14685* (2013.01); *G02B 2006/12061* (2013.01); *G02B 2006/12123* (2013.01); *G02B 2006/12138* (2013.01)

(56) References Cited

U.S. PATENT DOCUMENTS

| | | | |
|---|---|---|---|
| 8,866,251 B2 | 10/2014 | Hirano | |
| 9,142,578 B2 | 9/2015 | Tomita | |
| 2008/0135732 A1* | 6/2008 | Toumiya | H01L 27/14625 250/208.1 |
| 2009/0283807 A1* | 11/2009 | Adkisson | H01L 24/05 257/292 |
| 2011/0006387 A1 | 1/2011 | Katsuno et al. | |
| 2011/0024857 A1 | 2/2011 | Toumiya | |
| 2011/0089514 A1 | 4/2011 | Tay | |
| 2012/0213466 A1* | 8/2012 | Golubovic | H01L 27/15 385/14 |
| 2012/0267741 A1* | 10/2012 | Suzuki | H01L 27/14685 257/432 |
| 2012/0267742 A1 | 10/2012 | Yano | |
| 2016/0099277 A1* | 4/2016 | Vora | H01L 27/14663 257/428 |

FOREIGN PATENT DOCUMENTS

| | | |
|---|---|---|
| JP | 2009-176952 A | 8/2009 |
| JP | 2010-087039 A | 4/2010 |
| JP | 2012-227510 A | 11/2012 |

\* cited by examiner

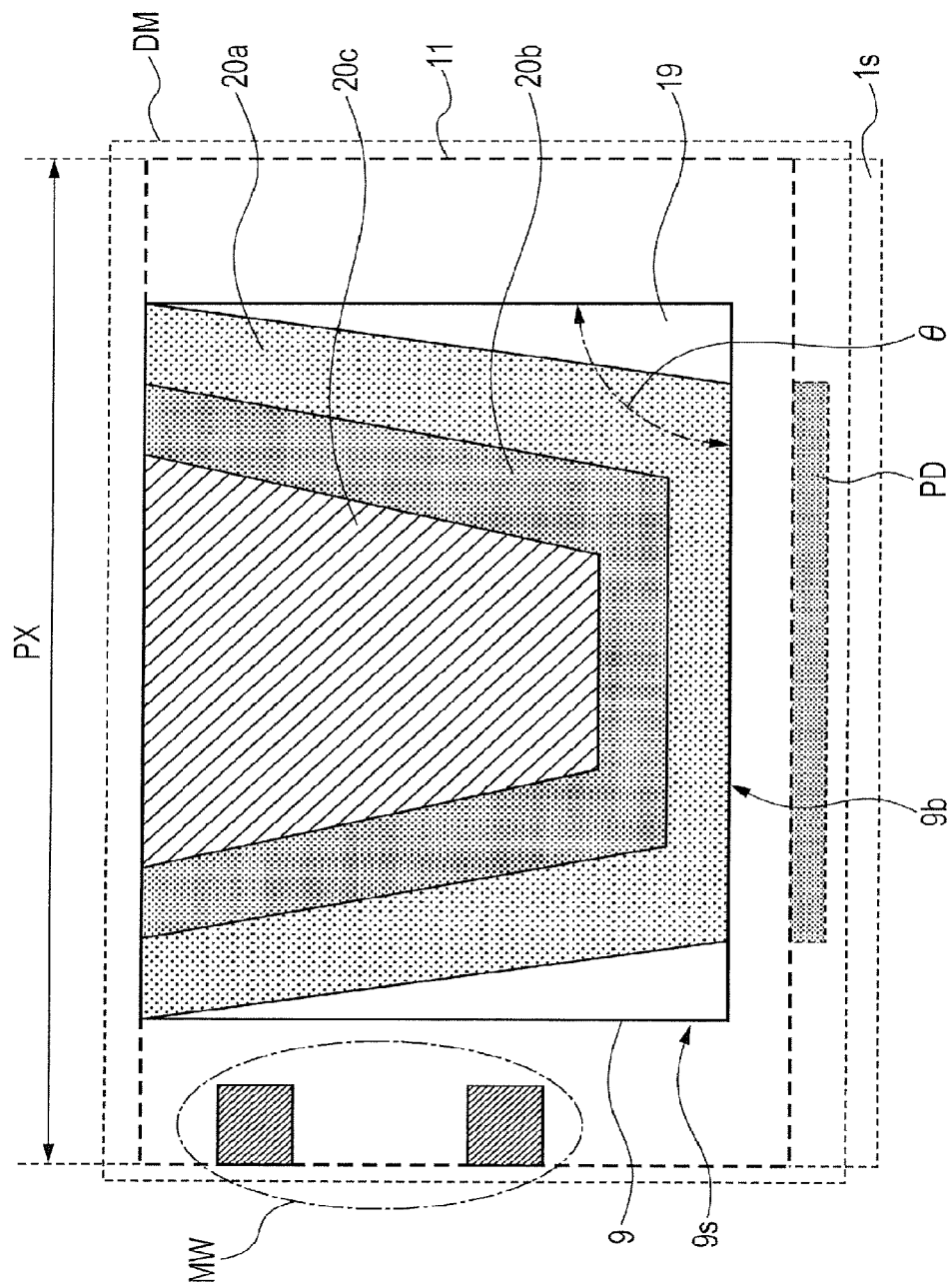

SEMICONDUCTOR INTEGRATED CIRCUIT DEVICE

CROSS-REFERENCE TO RELATED APPLICATIONS

The disclosure of Japanese Patent Application No. 2013-133469 filed on Jun. 26, 2013 including the specification, drawings, and abstract is incorporated herein by reference in its entirety.

BACKGROUND

The present application relates to a semiconductor integrated circuit device (or semiconductor device) and can be applied to, for example, a semiconductor integrated circuit device having a solid-state imaging device.

Japanese Patent Application Laid-Open No. 2007-305690 (Patent Document 1) relates to a solid-state imaging device. It discloses a waveguide having, at a lower end thereof, an anti-reflective film using a silicon nitride film, substantially penetrating through a surface wiring layer, and having a high refractive index at the center portion of the waveguide.

Japanese Patent Application Laid-Open No. 2012-227510 (Patent Document 2) or U.S. Patent Application Publication No. 2012-267741 (Patent Document 3) corresponding thereto relates to a solid-state imaging device. The device disclosed herein has an anti-reflective film right above a photodiode and a waveguide extending downward from the vicinity of the upper end of a wiring layer to the middle of the wiring layer and filled with a high refractive index insulating film.

Japanese Patent Application Laid-Open No. 2006-128383 (Patent Document 4) relates to a CMOS solid-state imaging device. Disclosed herein is a waveguide that is made of an insulating film having a refractive index higher than therearound and is tapered downward.

[Patent Document 1] Japanese Patent Application Laid-Open No. 2007-305690
[Patent Document 2] Japanese Patent Application Laid-Open No. 2012-227510
[Patent Document 3] U.S. Patent Application Publication No. 2012-267741
[Patent Document 4] Japanese Patent Application Laid-Open No. 2006-128383

SUMMARY

For example, a CMOS sensor (CMOS imaging device), which is one of imaging devices, has had various problems with a decrease in pixel size. The problems are, for example, deterioration in image quality due to reduction in the number of saturation electrons, an increase in white scratches at a picture level, blooming caused by crosstalk, and generation of luminous dots during a dark time.

In order to avoid such problems, increasing the number of photons supplied to one pixel is effective and to realize this, a waveguide having, at the center portion thereof, a high refractive index member is provided above each photodiode as one measure.

The investigation by the present inventors has however revealed that only by the above-mentioned measure, it is difficult to prevent deterioration in pixel characteristics of an imaging device (such as CMOS sensor) which is rapidly decreasing in size.

Means for overcoming such problems will next be described. Other problems and novel features will be apparent from the description herein and accompanying drawings.

The summary of a typical embodiment, among embodiments disclosed herein, will next be described briefly.

The following is the summary of one embodiment of the present application. Provided is a semiconductor integrated circuit device having a photodiode array region and having, in each of pixel regions, a waveguide holding hole above the photodiode. The hole is filled with a silicon oxide-based sidewall insulating film having a substantially perpendicular sidewall and reaching the bottom surface and a multilayer silicon nitride-based insulating film having a refractive index becoming higher toward the inside of the hole.

Advantages available by a typical embodiment, among the embodiments disclosed herein, will next be described briefly.

The above-mentioned embodiment of the present application makes it possible to prevent deterioration of pixel characteristics which will otherwise occur due to downsizing of imaging devices.

BRIEF DESCRIPTION OF THE DRAWINGS

FIG. 31 is a schematic cross-sectional view of a chip corresponding to the cross-section X-X' of FIG. 4 for describing the summary of First Embodiment corresponding to FIG. 5 (partially, FIG. 7 or FIG. 12).

DETAILED DESCRIPTION

[Summary of Embodiment]

Figure 1:
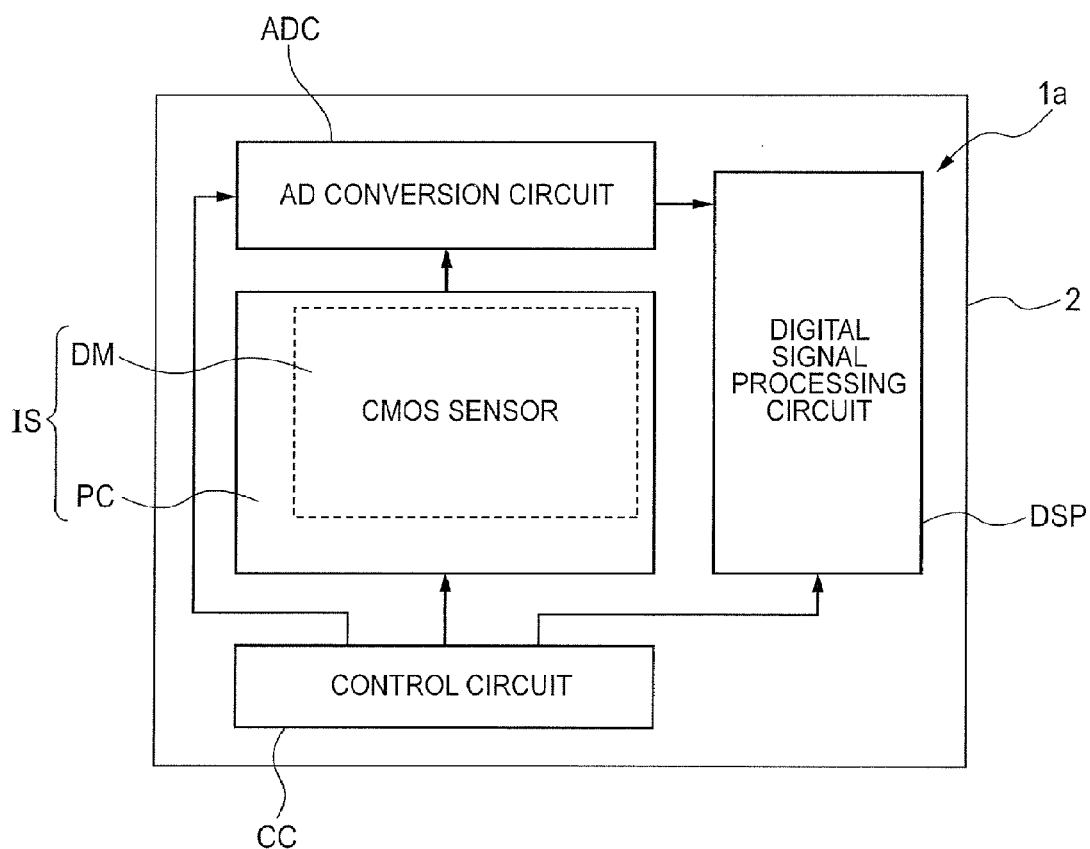
FIG. 1 is an upper-surface circuit diagram of an overall chip for describing one example of a circuit structure of a CMOS chip having a CMOS image sensor which is a specific example of a semiconductor integrated circuit device according to First Embodiment of the present application.

First, the summary of the typical embodiments disclosed herein will be described.

1. A semiconductor integrated circuit device including:
(a) a semiconductor substrate having a first main surface,
(b) a photodiode array region provided on the side of the first main surface of the semiconductor substrate;
(c) a number of pixel regions provided in matrix form in the photodiode array region,
(d) an interlayer insulating film provided on the first main surface of the semiconductor substrate including the photodiode array region, and
(e) a multilayer wiring provided in the interlayer insulating film. In this semiconductor integrated circuit device, each of the pixel regions includes:
(c1) a photodiode provided in a surface region of the first main surface of the semiconductor substrate,
(c2) a waveguide holding hole provided in the interlayer insulating film above the photodiode and having a substantially perpendicular sidewall,
(c3) a silicon oxide-based sidewall insulating film covering the side surface of the waveguide holding hole and reaching the bottom surface thereof,
(c4) a first silicon nitride-based insulating film covering the surface of the silicon oxide-based sidewall insulating film and the bottom surface of the waveguide holding hole,
(c5) a second silicon nitride-based insulating film covering, in the waveguide holding hole, the surface of the first silicon nitride-based insulating film and having a refractive index higher than that of the first silicon nitride-based insulating film, and
(c6) a third silicon nitride-based insulating film provided on the second silicon nitride-based insulating film so as to be embedded in the waveguide holding hole and having a refractive index higher than that of the second silicon nitride-based insulating film.

2. In the semiconductor integrated circuit device as described above in 1, the photodiode array region configures a CMOS image sensor.

3. In the semiconductor integrated circuit device as described above in 2, a width of an upper portion of the first silicon nitride-based insulating film is smaller than a width of a lower portion thereof.

4. In the semiconductor integrated circuit device as described above in any one of 1 to 3, a width of an upper portion of the second silicon nitride-based insulating film is smaller than a width of a lower portion thereof.

5. In the semiconductor integrated circuit device as described above in any one of 1 to 4, the interlayer insulating film and the semiconductor substrate have therebetween an anti-reflective film.

6. In the semiconductor integrated circuit device as described above in 5, the waveguide holding hole reaches the anti-reflective film.

7. In the semiconductor integrated circuit device as described above in any one of 1 to 6, the waveguide holding hole reaches the first main surface of the semiconductor substrate.

8. A semiconductor integrated circuit device including:
(a) a semiconductor substrate having a first main surface,
(b) a photodiode array region provided on the side of the first main surface of the semiconductor substrate;
(c) a number of pixel regions provided in matrix form in the photodiode array region,
(d) an interlayer insulating film provided on the first main surface of the semiconductor substrate including the photodiode array region, and
(e) a multilayer wiring provided in the interlayer insulating film. In the semiconductor integrated circuit device, each of the pixel regions includes:
(c1) a photodiode provided in a surface region of the first main surface of the semiconductor substrate,
(c2) a waveguide holding hole provided in the interlayer insulating film above the photodiode,
(c3) a first silicon nitride-based sidewall insulating film covering the side surface of the waveguide holding hole and reaching the bottom surface of the waveguide holding hole,
(c4) a second silicon nitride-based sidewall insulating film covering the surface of the first silicon nitride-based sidewall insulating film, reaching the bottom surface of the waveguide holding hole, and having a refractive index higher than that of the first silicon nitride-based sidewall insulating film, and
(c5) a third silicon nitride-based insulating film provided on the second silicon nitride-based sidewall insulating film so as to be embedded in the waveguide holding hole and having a refractive index higher than that of the second silicon nitride-based sidewall insulating film.

9. In the semiconductor integrated circuit device as described above in 8, the photodiode array region configures a CMOS image sensor.

10. In the semiconductor integrated circuit device as described above in 8 or 9, the waveguide holding hole is tapered toward the side of the semiconductor substrate.

11. In the semiconductor integrated circuit device as described above in 8 or 9, the waveguide holding hole has a substantially perpendicular sidewall and each of the pixel regions further includes:
(c6) a silicon oxide-based sidewall insulating film covering the side surface of the waveguide holding hole and reaching the bottom surface of the hole.

12. In the semiconductor integrated circuit device as described above in any one of 8 to 11, the interlayer insulating film and the semiconductor substrate have therebetween an anti-reflective film.

13. In the semiconductor integrated circuit device as described above in 12, the waveguide holding hole reaches the anti-reflective film.

14. In the semiconductor integrated circuit device as described above in any one of 8 to 13, the waveguide holding hole reaches the first main surface of the semiconductor substrate.

15. A semiconductor integrated circuit device including:
(a) a semiconductor substrate having a first main surface,
(b) a photodiode array region provided on the side of the first main surface of the semiconductor substrate;
(c) a number of pixel regions provided in matrix form in the photodiode array region,
(d) an interlayer insulating film provided on the first main surface of the semiconductor substrate including the photodiode array region, and (e) a multilayer wiring provided in the interlayer insulating film. In the semiconductor integrated circuit device, each of the pixel regions includes:

(c1) a photodiode provided in a surface region of the first main surface of the semiconductor substrate, (c2) a waveguide holding hole provided in the interlayer insulating film above the photodiode and tapered toward the side of the semiconductor substrate, (c3) a first silicon nitride-based insulating film covering the side surface and bottom surface of the waveguide holding hole, (c4) a second silicon nitride-based insulating film covering, in the waveguide holding hole, the surface of the first silicon nitride-based, insulating film and having a refractive index higher than that of the first silicon nitride-based insulating film, and (c5) a third silicon nitride-based insulating film provided on the second silicon nitride-based insulating film so as to be embedded in the waveguide holding hole and having a refractive index higher than that of the second silicon nitride-based insulating film. Further, in the semiconductor integrated circuit device, a width of the upper portion of the first silicon nitride-based insulating film is smaller than a width of the lower portion thereof and a width of the upper portion of the second silicon nitride-based insulating film is smaller than a width of the lower portion thereof.

16. In the semiconductor integrated circuit device as described above in 15, the photodiode array region configures a CMOS image sensor.

17. In the semiconductor integrated circuit device as described above in 15 or 16, the interlayer insulating film and the semiconductor substrate have therebetween an anti-reflective film.

18. In the semiconductor integrated circuit device as described above in 17, the waveguide holding hole reaches the anti-reflective film.

19. In the semiconductor integrated circuit device as described above in any one of 15 to 18, the waveguide holding hole reaches the first main surface of the semiconductor substrate.

The other summary of the typical embodiments disclosed herein will next be described.

20. A semiconductor integrated circuit device including:

(a) a semiconductor substrate having a first main surface, (b) a photodiode array region provided on the side of the first main surface of the semiconductor substrate;

(c) a number of pixel regions provided in matrix form in the photodiode array region, (d) an interlayer insulating film provided on the first main surface of the semiconductor substrate including the photodiode array region, and (e) a multilayer wiring provided in the interlayer insulating film. In the semiconductor integrated circuit device, each of the pixel regions includes:

(c1) a photodiode provided in a surface region of the first main surface of the semiconductor substrate, (c2) a waveguide holding hole provided in the interlayer insulating film above the photodiode and is tapered toward the side of the semiconductor substrate, (c3) a first silicon nitride-based insulating film covering the side surface and bottom surface of the waveguide holding hole, (c4) a second silicon nitride-based insulating film covering, in the waveguide holding hole, the surface of the first silicon nitride-based insulating film and having a refractive index higher than that of the first silicon nitride-based insulating film, and (c5) a third silicon nitride-based insulating film provided on the second silicon nitride-based insulating film so as to be embedded in the waveguide holding hole and having a refractive index higher than that of the second silicon nitride-based insulating film. Further, in the semiconductor integrated circuit device, a width of the upper portion of the first silicon nitride-based insulating film is smaller than a width of the lower portion thereof.

21. In the semiconductor integrated circuit device as described above in 20, the photodiode array region configures a CMOS image sensor.

22. In the semiconductor integrated circuit device as described above in 20 or 21, the interlayer insulating film and the semiconductor substrate have therebetween an anti-reflective film.

23. In the semiconductor integrated circuit device as described above in 22, the waveguide holding hole reaches the anti-reflective film.

24. In the semiconductor integrated circuit device as described above in any one of 20 to 23, the waveguide holding hole reaches the first main surface of the semiconductor substrate.

[Explanation of Description Manner, Basic Terms, and Usage in the Present Application]

1. In the present application, a description in embodiments may be made after divided in a plurality of sections if necessary for the sake of convenience. These sections are not independent from each other, but they may each be a part of a single example or one of them may be a partial detail of the other or a modification example of a part or whole of the other one unless otherwise particularly specified. In principle, a description of a portion similar to that described before is not repeated. Moreover, when a reference is made to constituent components in the embodiments, they are not essential unless otherwise particularly specified, limited to the number theoretically, or apparent from the context.

Further, the term "semiconductor device" or "semiconductor integrated circuit device" as used herein means mainly a simple body of various transistors (active elements), a device obtained by integrating such a simple transistor as a main component with a resistor, a capacitor, and the like on a semiconductor chip or the like (for example, a single crystal silicon substrate), or a packaged semiconductor chip or the like. Typical examples of the various transistors include a MISFET (metal insulator semiconductor field effect transistor) represented by a MOSFET (metal oxide semiconductor field effect transistor). In this case, typical examples of the configuration of an integrated circuit include a CMIS (complementary metal insulator semiconductor) type integrated circuit represented by s CMOS (complementary metal oxide semiconductor) type integrated circuit having an N channel type MISFET and a P channel type MISFET in combination.

The wafer step of a today's semiconductor integrated circuit device, that is, LSI (large scale integration) is usually considered to have two parts. A first one is a FEOL (front end of line) step roughly ranging from carrying-in of silicon wafers as a raw material to a premetal step (including formation of an interlayer insulating film and the like between the lower end of an M1 wiring layer and a gate electrode structure, formation of a contact hole, formation of a tungsten plug, filling, and the like). Second one is a BEOL step roughly ranging from the formation of the M1 wiring layer to the formation of a pad opening in a final passivation film on an aluminum-based pad electrode (or a copper pad electrode) (in a wafer level package process, this process is included).

The term "interlayer insulating film" as used herein includes an insulating film in a metal wiring layer, an insulating film between metal layers, a premetal insulating film, a barrier insulating film of each wiring layer, and the like unless otherwise particularly specified or unless otherwise evident.

In the present application, for the sake of convenience, an attention is paid to the layer of an interlayer insulating film and the same layer name is given to a wiring and a via belonging to the same interlayer insulating film. More specifically, a via between a first-layer embedded wiring and a second-layer embedded wiring is called "second-layer via".

2. Similarly, in the description of the embodiments and the like, the term "X made of A" with regard to a material, component, or the like does not exclude a member containing a component other than A as a principal component unless otherwise particularly specified or unless otherwise evident from the context. For example, with regard to a component, the above term means "X containing A as a principal component" or the like. It is needless to say that for example, the term "silicon member" or the like is not limited to pure silicon but it may include a member containing a multicomponent alloy having silicon as a main component such as SiGe alloy; an additive, and the like.

Similarly, the term "silicon oxide film", "silicon oxide-based insulating film", or the like includes not only relatively pure undoped silicon oxide (undoped silicon dioxide) but also includes an insulating film having another silicon oxide as a main component. For example, silicon oxide-based insulating film doped with an impurity such as TEOS-based silicon oxide, PSG (phosphorus silicate glass, or BPSG (borophosphosilicate glass) is also a silicon oxide film. As well as a thermal oxide film and a CVD oxide film, a film obtained by the method of application such as SOG (spin on glass) or nano-clustering silica (NSC) is also a silicon oxide film or a silicon oxide-based insulating film. In addition, a Low-k insulating films such as FSG (fluorosilicate glass), SiOC (silicon oxycarbide), carbon-doped silicon oxide, or OSG (organosilicate glass) is also a silicon oxide film or a silicon oxide-based insulating film. Similarly, a silica-based Low-k insulating film (porous insulating film, the term "porous" includes "molecularly porous") obtained by introducing pores in such a member is also a silicon oxide film or a silicon oxide-based insulating film.

A silicon-based insulating film conventionally used in a semiconductor field along with the silicon oxide-based insulating film is a silicon nitride-based insulating film. Examples of the material belonging to this group include SiN, SiCN, SiNH, and SiCNH. The term "silicon nitride" as used herein includes both SiN and SiNH unless otherwise particularly specified. Similarly, the term "SiCN" as used herein includes both SiCN and SiCNH unless otherwise particularly specified.

It is to be noted that SiC has properties similar to those of SiN. Although SiON is often classified rather as a silicon oxide-based insulating film, it is close to SiC, SiN, or the like when used as an etch stop film.

A silicon nitride film is frequently used as an etch stopper film, that is, CESL (contact etch-stop layer) in the SAC (self-aligned contact) technology and in addition, it can also be used as a stress application film in the SMT (stress memorization technique).

3. The term "wafer" means a single crystal silicon wafer on which a semiconductor integrated circuit device (also a semiconductor device or an electronic device) is formed. It is needless to say that the term also embraces a composite wafer between an insulating substrate such as epitaxial wafer, SOI substrate, or LCD glass substrate and a semiconductor layer.

4. Preferred examples of the shape, position, attribute, and the like will be shown below, however, it is needless to say that the shape, position, attribute, and the like are not strictly limited to these preferred examples unless otherwise particularly specified or unless otherwise evident from the context. Accordingly, for example, the term "square" embraces "substantially square"; the term "orthogonal" embraces "substantially orthogonal", and the term "coincide with" embraces "substantially coincide with". This also applies to the terms "parallel" and "right angle". For example, the term "parallel" embraces a position away by 10 degrees from a complete parallel position.

The term "overall region", "whole region", "entire region", or the like embraces "substantially overall region", "substantially whole region", "substantially entire region" or the like, respectively. Accordingly, for example, the term "overall region", "whole region", or "entire region" embraces when a portion of the region accounting for 80% or more of the area thereof. This also applies to "whole circumference", "whole length", or the like.

Further, with regard to the shape of a member or the like, the term "rectangular" embraces "substantially rectangular". Accordingly, for example, when a member has a rectangular portion and an unrectangular portion and an area of the latter portion is less than about 20% of the whole area, this member is regarded rectangular. This also applies to the term "cyclic" or the like. In this case, when a cyclic body is divided, a portion having this divided component portion inserted therein or exserted therefrom is a part of the cyclic body.

With regard to the term "periodicity", the term "periodic" embraces "substantially periodic". When a difference of individual components in periodicity is less than about 20%, these individual components are regarded "periodic". Further, when less than about 20% of the components that should have periodicity are outside the above range, these components are regarded "periodic" as a whole.

The definition in this section is a general one. When a different definition is applied to the following individual descriptions, priority is given to the definition used in the individual description. With regard to a portion not specified in the individual description, the definition or specification in this section is effective unless otherwise definitely denied.

5. When a reference is made to a specific number or amount, the number or amount may be greater than or less than the specific number or amount unless otherwise particularly specified, limited to the specific number or amount theoretically, or apparent from the context.

6. The term "photodiode array region" as used herein means an assembly of photodiodes formed in linear or two-dimensional matrix form on a semiconductor substrate.

The term "image sensor" means a device having a photodiode array region. It therefore embraces both a CCD image sensor and a CMOS image sensor.

Further, the term "CMOS image sensor" as used herein means a semiconductor device formed by a CMOS process and a pixel region in a photodiode array region of the device is an active type (including a type in which an amplifier is shared by a plurality of cells). In general, not only a semiconductor device having an active type pixel region but also that having a passive type pixel region is called "CMOS image sensor".

7. In the present application, when the sidewall of a waveguide holding hole is "vertical" or "substantially vertical", the angle (internal angle of the sidewall) with a horizontal plane falls within a range of from about 83 degrees to about 97 degrees including 90 degrees. This definition also applies to the definition of "rectangular" with regard to the cross-sectional shape of a waveguide holding hole or a waveguide. With regard to the hole, the term "internal angle" means, supposing that the bottom surface is flat, an angle between the bottom surface and an inner side surface inside the hole. When the hole is forward tapered (tapered downward, that is, narrower at the bottom), its internal angle is typically 90 degrees or more.

[Details of Embodiments]

Embodiments will next be described more specifically. In all the drawings, the same or like members will be identified by the same or like symbols or reference numerals and overlapping descriptions will be omitted in principle.

In the accompanying drawings, hatching or the like is sometimes omitted even from the cross-section when it makes the drawing complicated or when a member can be discriminated clearly from a vacant space. In relation thereto, even a two-dimensionally closed hole may be shown without a background outline thereof when it is obvious from the description or the like that the hole is two-dimensionally closed. On the other hand, even a portion other than a cross section may be hatched to clearly show that the hatched portion is not a vacant space.

With regard to alternative naming, when one of the two is called "first" and the other is called "second", they are sometimes named according to the typical embodiment, but it is needless to say that even if it is called "first", naming is not limited to this choice.

1. Description on one example of circuit structure of a CMOS chip having a CMOS image sensor which is a specific example of a semiconductor integrated circuit device according to First Embodiment of the present application (mainly from FIG. 1 to FIG. 3)

This section specifically describes a typical configuration corresponding to a semiconductor integrated circuit chip for digital camera having thereon a CMOS image sensor as an example. Needless to say, the following example can be applied to not only digital cameras but also semiconductor integrated circuit devices for processing optical image information in general.

The matters described in this section will be a basis for the matters which will be described in all the following sections. An overlapping description will therefore be omitted in and after Section 2.

To simplify the description, a four-transistor type pixel will be described specifically as an example. But the pixel may have another configuration or it may have a multi-pixel sharing type.

Here, as a photodiode array region, that having pixels arranged in matrix form will be described specifically as an example. The pixels may be arranged by shifting them by a half pitch at every other column.

Further, a device having an X-Y addressed photodiode array region will next be described specifically as an example, but it is needless to say that another readout system may be employed.

Figure 2:
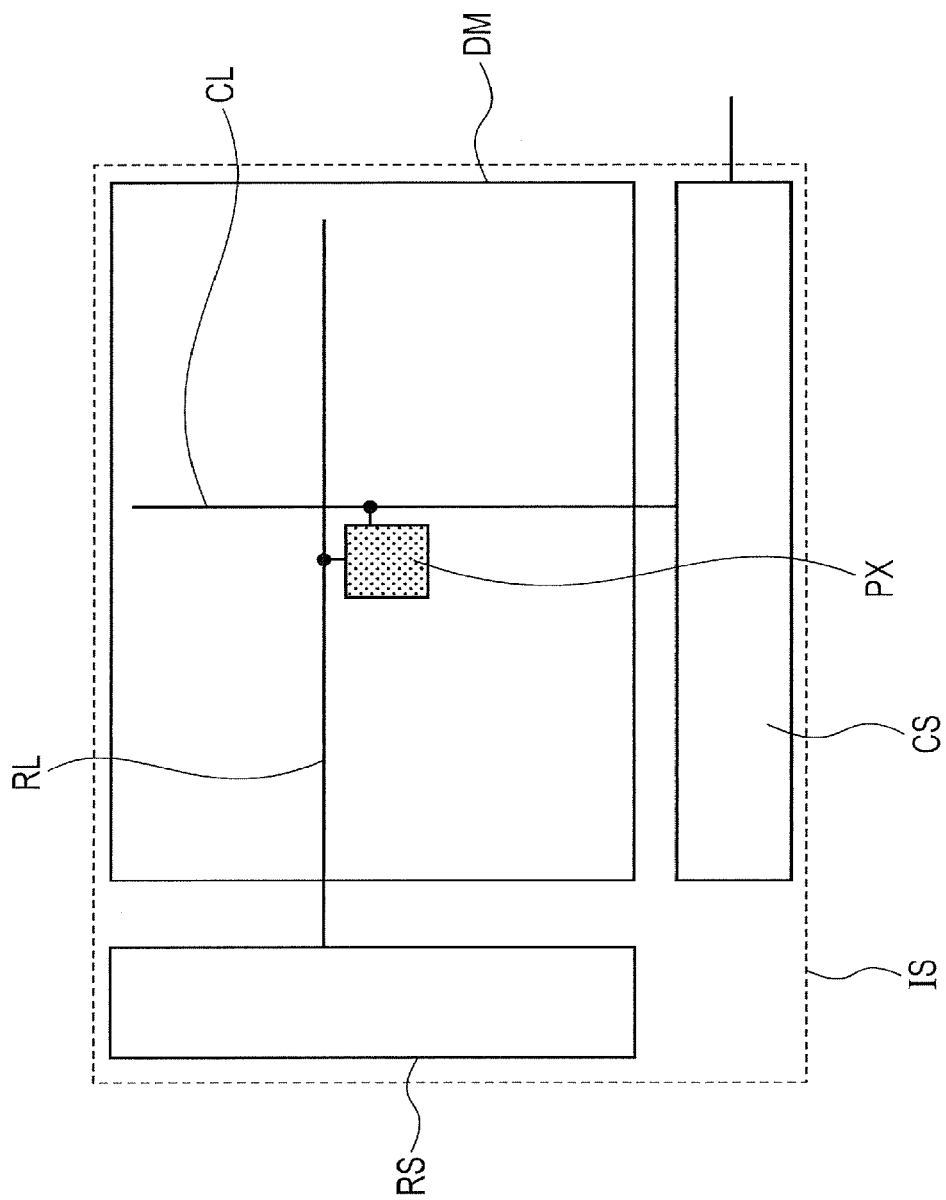
FIG. 2 is an overall circuit diagram showing one example of the CMOS image sensor region IS of FIG. 1.
Figure 3:
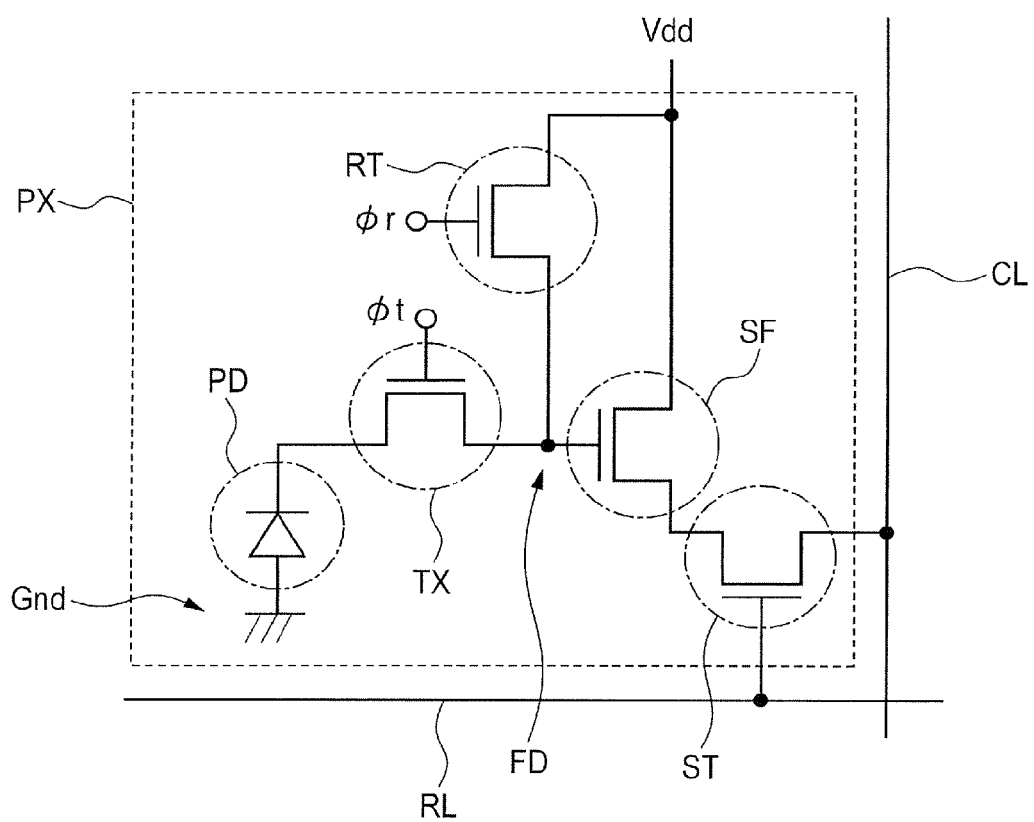
FIG. 3 is an overall circuit diagram showing one example of the pixel region PX of FIG. 2.

FIG. 1 is an upper-surface circuit diagram of an overall chip for describing one example of a circuit structure of a CMOS chip having a CMOS image sensor which is a specific example of a semiconductor integrated circuit device according to First Embodiment of the present application. FIG. 2 is an overall circuit diagram showing one example of the CMOS image sensor region IS of FIG. 1. FIG. 3 is an overall circuit diagram showing one example of the pixel region PX of FIG. 2. Referring to these drawings, one example of a circuit structure of a CMOS chip having a CMOS image sensor which is a specific example of the semiconductor integrated circuit device according to First Embodiment of the present application will next be described.

First, one example of a circuit structure on a CMOS chip is shown in FIG. 1. As shown in FIG. 1, a chip 2 has, on a first main surface 1a (device surface, that is, a surface opposite to a second main surface 1b) thereof, a CMOS image sensor IS (CMOS image sensor region, CMOS image sensor circuit portion) having a photodiode array region DM and a peripheral circuit region PC. An output signal from the CMOS image sensor circuit portion IS is converted into a digital signal, for example, at an AD conversion circuit region ADC (AD conversion circuit portion). The resulting signal is then supplied to, for example, a digital signal processing circuit region DSP (digital signal processing circuit portion) and is output outside as needed. These circuits are controlled, for example, by a control circuit region CC (control circuit portion).

Next, one example of the circuit structure of the CMOS image sensor region IS of FIG. 1 is shown in FIG. 2. As shown in FIG. 2, the CMOS image sensor region IS has therein a photodiode array region DM in which pixel regions PX (pixels) are arranged in a matrix form. A number of the pixel regions PX are electrically coupled to, at each row, corresponding row selection lines RL and a number of these row selection lines RL are controlled by a row selection circuit region RS (row selection circuit portion). Similarly, a number of these pixel regions PX are electrically coupled to, at each column, corresponding readout lines CL and a number of these readout lines CL are electrically coupled to a readout circuit region CS (readout circuit portion).

Next, one example of the circuit structure of the pixel region PX of FIG. 2 is shown in FIG. 3. As shown in FIG. 3, the pixel region PX has therein a photodiode PD having an anode to be coupled to a ground potential and the cathode of it is electrically coupled to a floating diffusion layer FD (floating diffusion layer node) via a transfer transistor TX. This transfer transistor TX is turned ON and OFF, while being controlled by a transfer signal Φt. This floating diffusion layer FD is electrically coupled to a power supply Vdd (power supply potential) via a reset transistor RT and it is controlled by a reset signal Φr. A signal charge (signal potential) transferred to the floating diffusion layer FD is amplified by an amplifying transistor SF and is electrically coupled to the readout line CL via a row selection transistor ST.

2. Description on one example (rectangular waveguide holding hole structure/silicon oxide-based sidewall structure/stepwise refractive index distribution system/silicon nitride multilayer filled structure) of a device structure of the pixel region of the CMOS image sensor of the semiconductor integrated circuit device according to First Embodiment of the present application (mainly, from FIG. 4 to FIG. 11).

This section specifically describes the structure of the pixel region and the like, taking the circuit structure and the like described in Section 1 as an example.

Matters which will be described in this section will become a basis of matters which will be described in all the following sections so that in Section 3 and thereafter, an overlapping description is omitted in principle.

A specific description will be made with a charge transfer type pixel as an example, but it is needless to say that another type pixel may also be used.

Further, a specific description will be made with a pixel having a pinned photodiode as an example, but it is needless to say that another type pixel may also be used.

Still further, a specific description on the structure of a substrate and an impurity region will be made with an N type substrate as an example. It is needless to say that it may be replaced by a P type substrate. Similarly, a specific description will be made with an N type substrate having a deep P well as an example, but it is needless to say that an N type substrate having a P type epitaxy region or a substrate not having a deep P well may also be used.

Sill further, a specific description will be made with a structure provided with an on-chip microlens, a color filter, or an inner lens as an example, but it is needless to say that a structure without any of them or without some of them may also be used.

Figure 4:
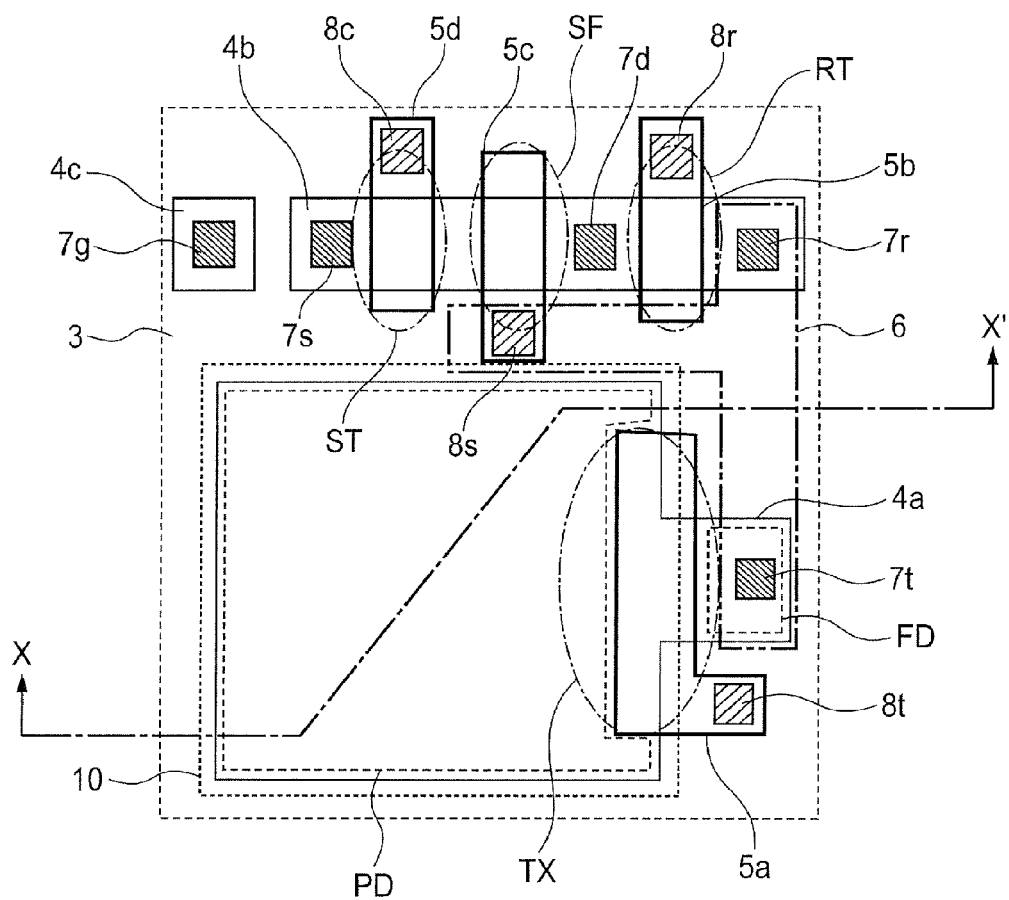
FIG. 4 is a layout diagram showing one example of a device layout corresponding to FIG. 3 for describing one example (rectangular waveguide holding hole structure/silicon oxide-based sidewall structure/stepwise refractive index distribution system/silicon nitride multilayer filled structure) of a device structure of the pixel region of the CMOS image sensor in the semiconductor integrated circuit device according to First Embodiment of the present application.
Figure 5:
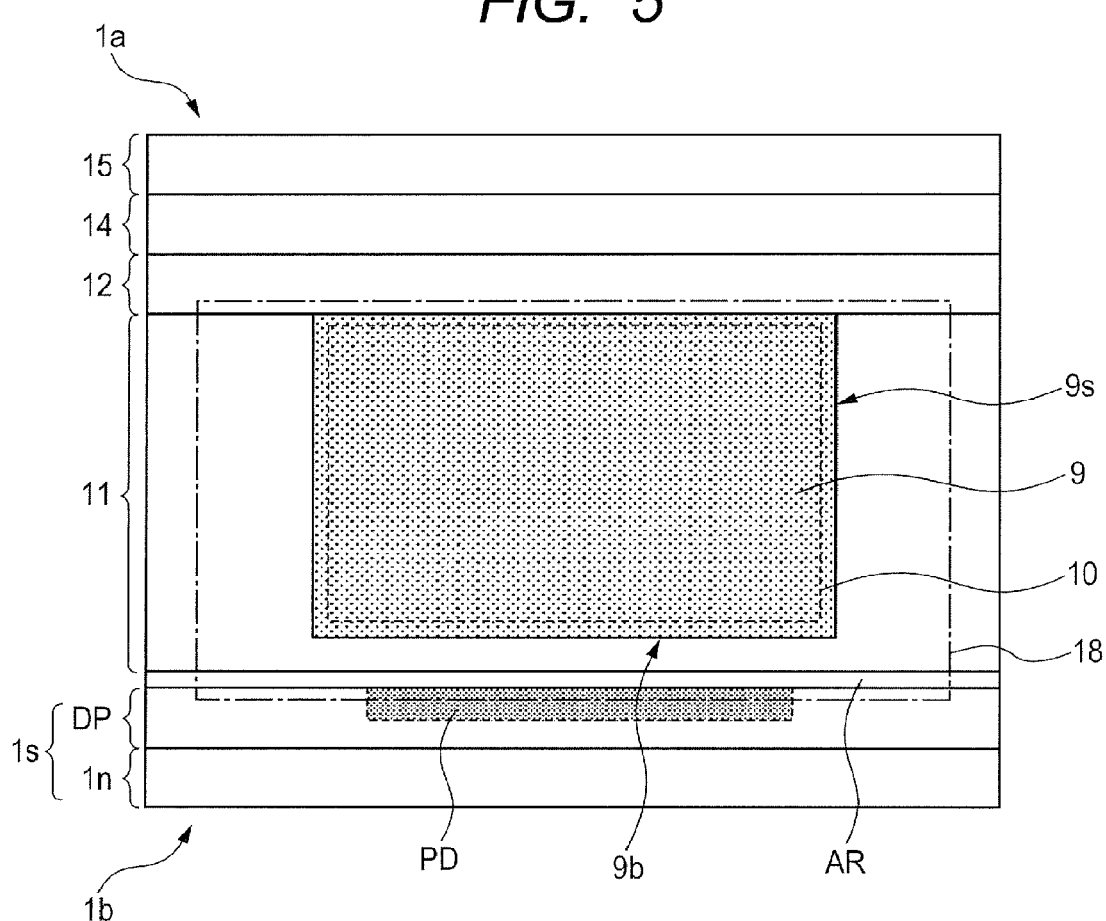
FIG. 5 is a chip cross-sectional view corresponding to the cross-section X-X' of FIG. 4 for showing the summary of one example of the cross-sectional structure of the pixel region PX of FIG. 2.
Figure 6:
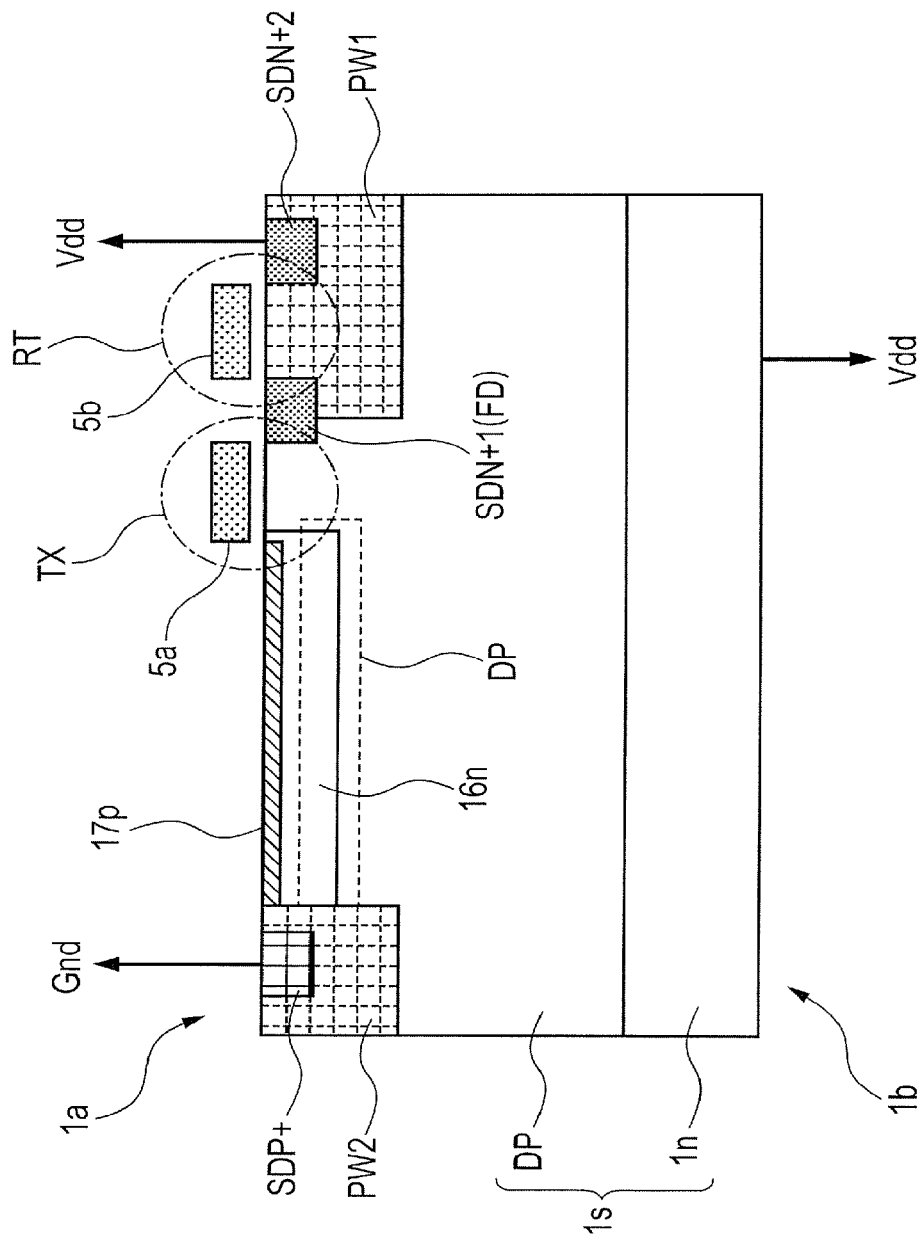
FIG. 6 is an explanatory view of a device cross-sectional structure substantially corresponding to the layout of FIG. 4 (a coupling structure and the like are partially omitted to facilitate understanding of the drawing)
Figure 7:
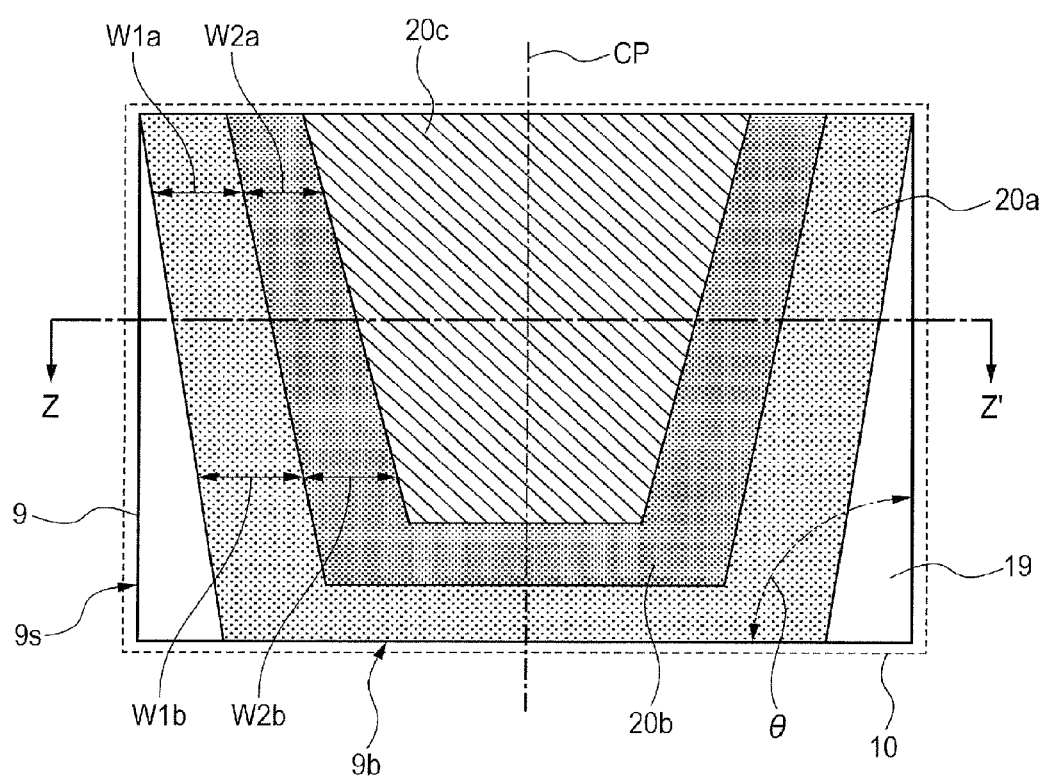
FIG. 7 is a fragmentary cross-sectional view of a device for describing the detailed structure of the waveguide 10 of FIG. 5.
Figure 8:
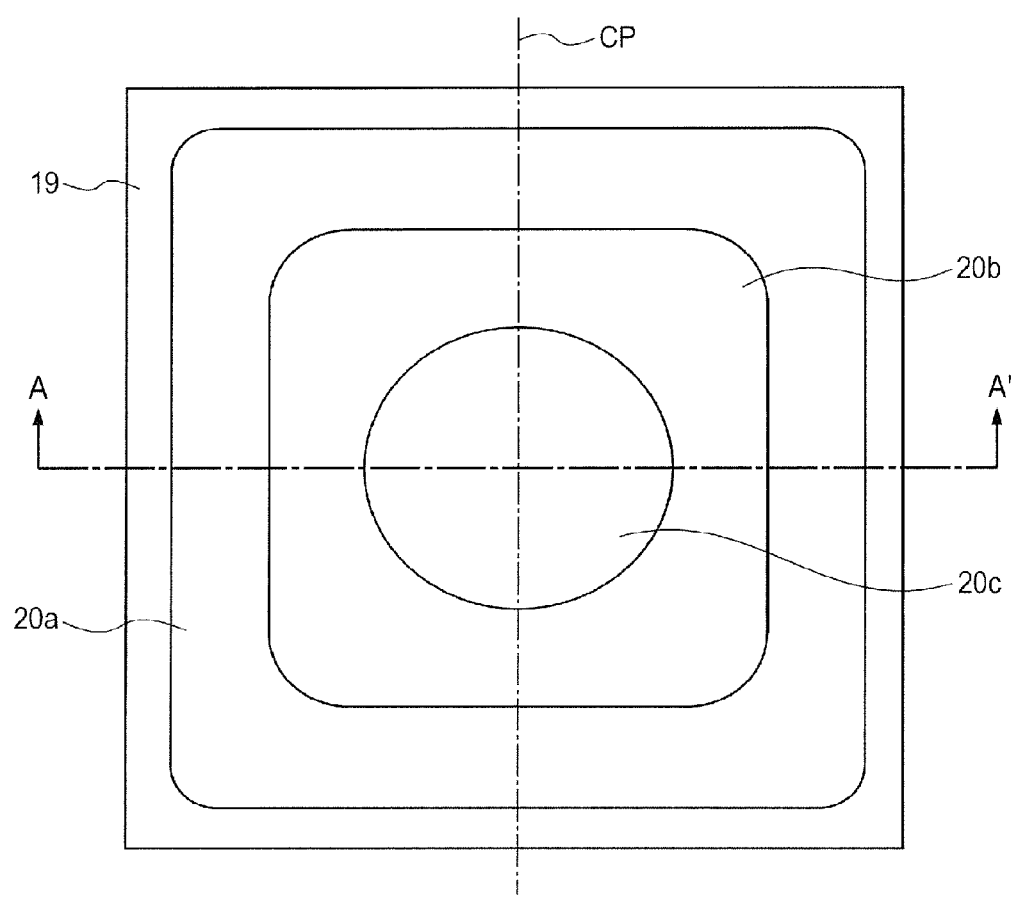
FIG. 8 is a cross-sectional view of the horizontal cross-section Z-Z' corresponding to a bisecting plane of the third silicon nitride-based insulating film 20c of FIG. 7 in the depth direction.
Figure 9:
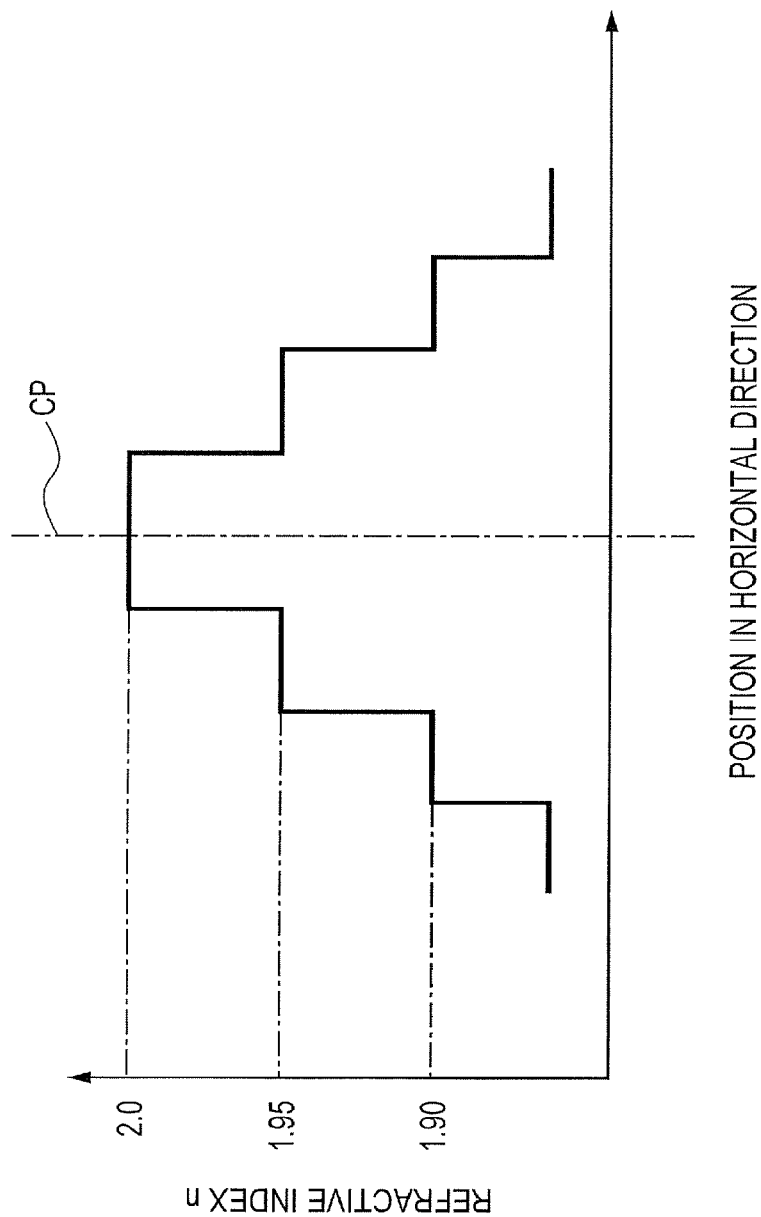
FIG. 9 is a refractive index distribution chart of the cross-section A-A' having the symmetry plane CP of FIG. 8 as a symmetry center.
Figure 10:
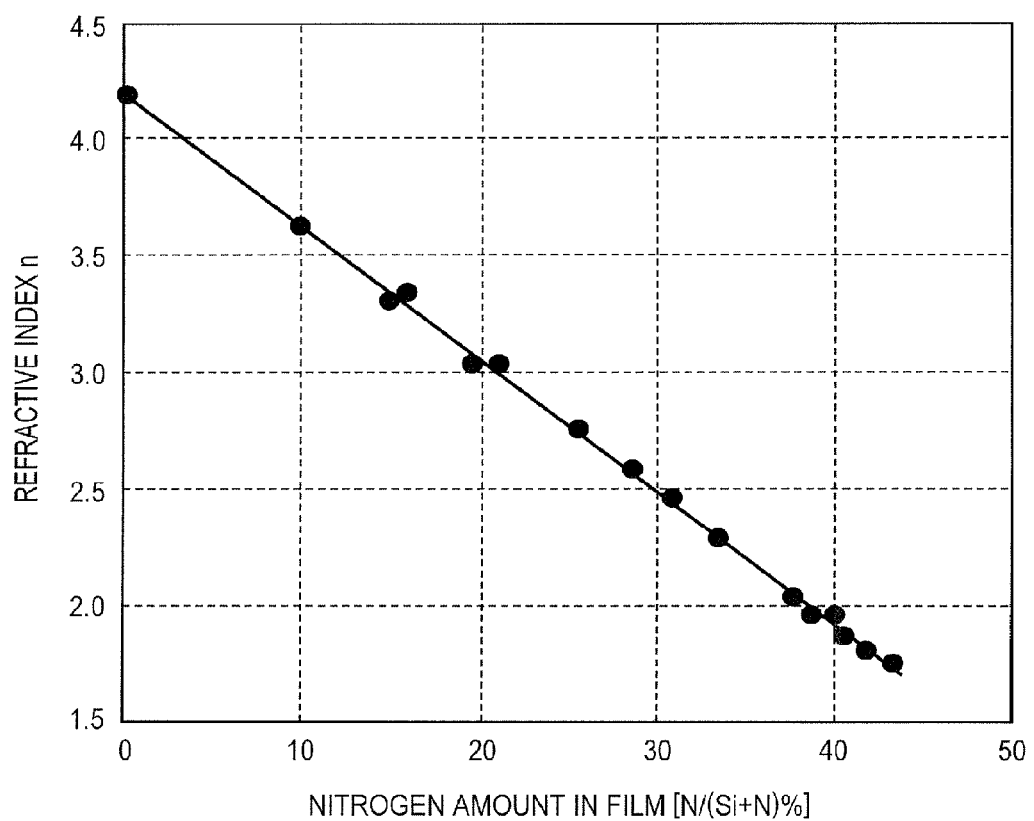
FIG. 10 is a data plot chart showing the relationship between a nitrogen amount in the silicon nitride film and a refractive index.
Figure 11:
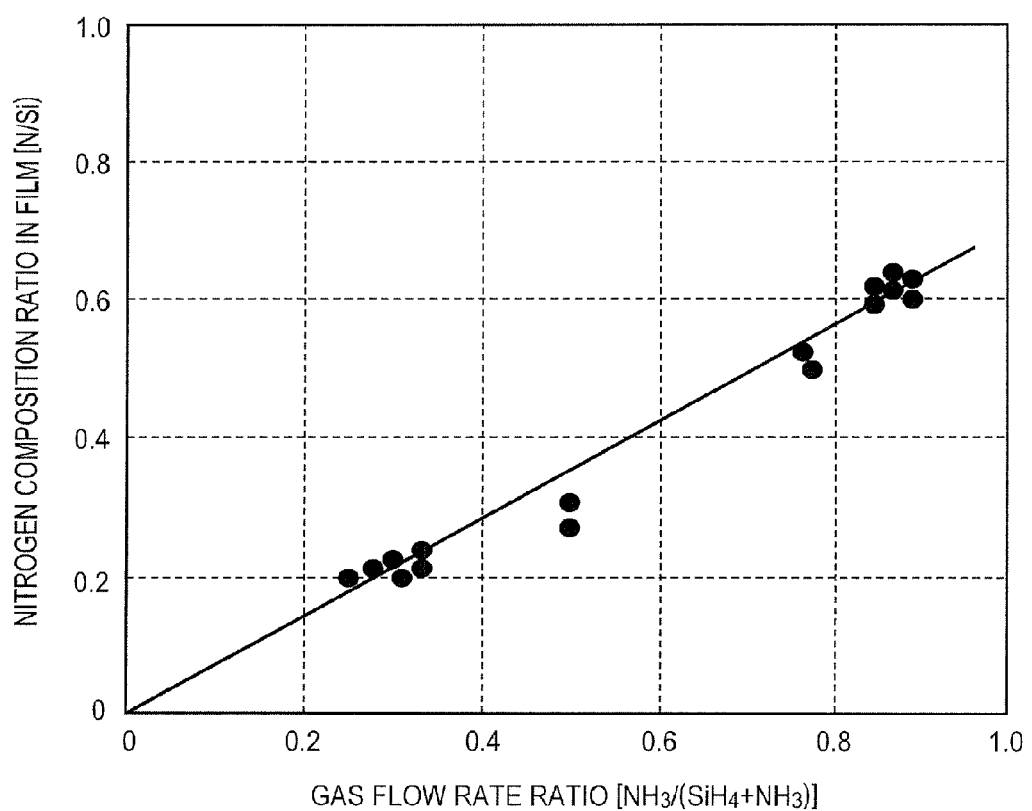
FIG. 11 is a data plot chart showing, in a typical silicon nitride film formation process, a gas flow rate ratio and a nitrogen composition ratio of the silicon nitride film thus formed.

FIG. 4 is a layout diagram showing one example of a device layout corresponding to FIG. 3 for describing one example (rectangular waveguide holding hole structure/silicon oxide-based sidewall structure/stepwise refractive index distribution system/silicon nitride multilayer filled structure) of a device structure of the pixel region of the CMOS image sensor in the semiconductor integrated circuit device according to First Embodiment of the present application. FIG. 5 is a chip cross-sectional view corresponding to the cross-section X-X' of FIG. 4 for showing the summary of one example of the cross-sectional structure of the pixel region PX of FIG. 2. FIG. 6 is an explanatory view of a device cross-sectional structure substantially corresponding to the layout of FIG. 4 (a coupling structure and the like are partially omitted to facilitate understanding of the drawing). FIG. 7 is a fragmentary cross-sectional view of a device for describing the detailed structure of the waveguide 10 of FIG. 5. FIG. 8 is a cross-sectional view of the horizontal cross-section Z-Z' corresponding to a bisecting plane of the third silicon nitride-based insulating film 20c of FIG. 7 in the depth direction. FIG. 9 is a refractive index distribution chart of the cross-section A-A' having the symmetry plane CP of FIG. 8 as a symmetry center. FIG. 10 is a data-plot chart showing the relationship between a nitrogen amount in the silicon nitride film and a refractive index. FIG. 11 is a data plot chart showing, in a typical silicon nitride film formation process, a gas flow rate ratio and a nitrogen composition ratio of the silicon nitride film thus formed. Referring to these drawings, one example (rectangular waveguide holding hole structure/silicon oxide-based sidewall structure/stepwise refractive index distribution system/silicon nitride multilayer filled structure) of a device structure of the pixel region of the CMOS image sensor in the semiconductor integrated circuit device according to First Embodiment of the present application will next be described.

One example of a planar layout of the pixel region PX of FIG. 3 is shown in FIG. 4. As shown in FIG. 4, in this example, the pixel region PX has therein a plurality of active regions 4a, 4b, and 4c and they are separated from each other by an STI region 3 (element isolation region).

The active region 4a has therein a photodiode PD and a transfer transistor TX and the active region 4b has therein a reset transistor RT, an amplifier transistor SF, and a row selection transistor ST. On the other hand, the active region 4c has therein a grounding contact portion 7g. In this example, the waveguide 10 is a little larger than the photodiode PD in a planar view and the former encloses therein the latter. It is needless to say that their sizes are not limited to the above-described one. The photodiode PD shown here is an almost rectangular planar shape, but it is not limited to a rectangle but may be a circle or a polygon with five or more sides. The active region 4a has, in the vicinity of the right end portion thereof, a gate electrode 5a of the transfer transistor TX. A transfer signal Φt (FIG. 3) is supplied thereto via a via portion 8t with a metal wiring.

The active region 4a has, at the right end portion thereof, a floating diffusion layer FD and a contact portion 7t with the metal wiring and they are coupled to the reset transistor RT, for example, via a mutual coupling wiring 6 (first-layer copper embedded wiring) and a contact portion 7r with the metal wiring. This mutual coupling wiring 6 is coupled to a gate electrode 5c of the amplifier transistor SF via a via portion 8s with the metal wiring. The active region 4b between the gate electrode 5c and a gate electrode 5b of the reset transistor RT has a power supply contact portion 7d.

The active region 4b between a contact portion 7s with the readout line CL (FIG. 3) of the row selection transistor ST and the gate electrode 5c of the amplifier transistor SF has a gate electrode 5d of the row selection transistor ST. This gate electrode 5d is electrically coupled to the row selection line RL (FIG. 3) via a via portion 8c of the raw selection line.

Next, the layer structure of the cross-section of the pixel region PX (including the waveguide and peripheral region 18 thereof) in the device cross-section corresponding to the cross-section X-X' of FIG. 4 is schematically shown in FIG. 5. As shown in FIG. 5, an N type single crystal silicon substrate 1s has, on the side of a first main surface 1a (device surface) thereof, a P type deep well region DP in this example. Therefore, the remaining portion, that is, a portion on the back side is an N type single crystal silicon substrate 1n. This P type deep well region DP has, in a surface region thereof, a photodiode PD. In this example, the photodiode PD is enclosed in the waveguide 10 in a planar view.

The N type single crystal silicon substrate 1s has, on the first main surface 1a, an anti-reflective film AR (which is, of course, not essential) and the anti-reflective film AR has thereon an interlayer insulating film 11 having a multilayer structure. As the anti-reflective film AR, preferred is, for example, a multilayer film comprised of, from the upper side, a silicon nitride film (for example, having a thickness of about 30 nm), a silicon nitride film (for example, having a thickness of about 30 nm), and a silicon oxide film (for example, having a thickness of about 30 nm).

The interlayer insulating film 11 has, from the surface thereof on the side of the first main surface 1a to the vicinity of the bottom surface, a waveguide holding hole 9. This hole has therein a waveguide 10 having a multilayer structure. In this example, the waveguide 10 is in contact with the interlayer insulating film 11 at the side surface 9s and the bottom surface 9b of the waveguide holding hole 9.

The interlayer insulating film 11 and the waveguide 10 have thereon an inner lens layer 12. This inner lens layer 12 has thereon a color filter layer 14. The inner lens layer 12 can be formed, for example, by processing a silicon nitride-based insulating film or the like by using CVD and lithography in combination. The color filter layer 14 can be formed, on the other hand, by conventional lithography using a color resist or the like. The color filter layer 14 has thereon a microlens layer 15. The microlens layer 15 can be formed, for example, by the melting method or etch back process.

One example of the typical dimension of the main portions in FIG. 5 will next be shown in order to facilitate a specific description of the device structure. Described specifically, the waveguide 10 has a width of, for example, about 700 nm and a height of, for example, about 500 nm; the interlayer insulating film 11 has a thickness of, for example, about 600 nm; the photodiode PD has a width of, for example, about 600 nm. In this example, the width of the photodiode PD is made smaller than the width of the waveguide 10, which is not essential but distribution of a signal light even to the periphery of a widened photodiode PD results in an increase in crosstalk.

Next, a cross-sectional structure of the pixel region PX corresponding to FIG. 3 is shown schematically in FIG. 6 to facilitate understanding of an operation principle. This drawing is simplified so that it does not completely correspond to FIG. 4. For example, the floating diffusion layer FD is typified by a single impurity region. As shown in FIG. 6, in this example, the semiconductor substrate 1s has, in the surface region on the side of the first main surface 1a thereof, P type well regions PW1 and PW2 more heavily doped than the P type deep region DP. The P type well region PW1 has, in the surface thereof, heavily doped N type regions SDN+1 and SDN+2 corresponding to the source and drain regions of the reset transistor RT or transfer transistor TX. The heavily doped N type region SDN+2 is electrically coupled to the power supply potential Vdd as a reference potential of the reset transistor. The heavily doped N type region SDN+1 is a floating diffusion layer FD. The heavily doped N type region SDN+1 and the heavily doped N type region SDN+2 have, between them and on the first main surface 1a of the semiconductor substrate 1s, a gate electrode 5b of the reset transistor RT via a gate insulating film or the like.

On the other hand, the P type well region PW2 has, in the surface thereof, a heavily doped P type region SDP+ for supplying a ground potential Gnd. The semiconductor substrate 1s has, in a surface region on the side of the first main surface 1a thereof, an N type cathode region 16n of the photodiode PD so as to have a border with the P type well region PW2. In this example, this N type cathode region configures a PN junction with the P type deep well region DP. The N type cathode region 16n has, in the surface thereof, a surface P+ type region 17p electrically coupled to the P type well region PW2 and it relaxes the influence of the surface on the photodiode PD.

The heavily doped N type region SDN+1 and the N type cathode region 16n have, between them and on the first main surface 1a of the semiconductor substrate 1s, a gate electrode 5a of the transfer transistor TX via a gate insulating film or the like.

At the time of operation, the N type substrate region 1n is electrically coupled to a power supply potential Vdd and the P type deep well region DP, the P type well regions PW1 and PW2, and the surface P+ type region 17p are electrically coupled to the ground potential Gnd. The PN junction configuring the photodiode PD is therefore reverse biased.

Next, one example of the internal structure of the waveguide 10 of FIG. 5 is shown in FIGS. 7 and 8. As shown in FIGS. 7 and 8, the waveguide holding hold 9 has, at the peripheral portion thereof contiguous to the sidewall 9s, for example, a silicon oxide-based sidewall insulating film 19. It has, on the bottom surface 9b and the side surface on the inner side of the hole, a first silicon nitride-based insulating film 20a. The waveguide holding hole 9 has, on the whole inner surface thereof on the first silicon nitride-based insulating film 20a, a second silicon nitride-based insulating film 20b. The second silicon-based insulating film 20b has thereon a third silicon nitride-based insulating film 20c which is embedded in the waveguide holding hole 9. As is apparent from FIG. 7, the cross-sectional shape is substantially symmetrical about a symmetry plane CP and in a planar view, as is apparent from FIG. 8, it has a substantially square shape or a rectangular shape close thereto, or a substantially N-sided polygonal shape (including a circular shape) in which N is 4 or more. It may also have another shape as needed. As shown in FIG. 8, the first, second, and third silicon nitride-based insulating films 20a, 20b, and 20c have a planar shape rounded at the corners thereof. The degree of roundness of the first silicon nitride-based insulating film 20a is smaller than that of the second silicon nitride-based insulating film 20b. This means that the latter film has a greater radius R. Similarly, the degree of roundness of the second silicon nitride-based insulating film 20b is smaller than that of the third silicon nitride-based insulating film 20c In this example, as is apparent from FIG. 7, the internal angle θ of the sidewall is substantially 90 degrees. A width W1a of the upper portion of the first silicon nitride-based insulating film 20a is smaller than a width W1b of the lower portion thereof. The term "width of the upper portion" as used herein means a horizontally measured thickness of a film portion which is higher than half of the depth of the third silicon nitride-based insulating film 20c and further, higher than half of the depth of the upper half portion. The term "width of the lower portion", on the other hand, means a thickness of a film portion which is lower than half of the depth of the third silicon nitride-based insulating film 20c and further, lower than half of the depth of the lower half portion. This thickness however should fall within a range of the depth of the third silicon nitride-based insulating film 20c. These definitions also apply to another film.

Similarly, a width W2a of the upper portion of the second silicon nitride-based insulating film 20b is smaller than a width W2b of the lower portion thereof.

Such a structure and dimensional relation make it possible to minimize undesired scattering or the like due to a curved wavefront, because the vertical components of the velocity of a signal light traveling downward in a vertical direction at the center of the waveguide 10 and a light traveling at the periphery of the waveguide 10 while obliquely heading to the center can be made uniform and at the same time, a wide area can be ensured for the wavefront at the lower half portion of the waveguide 10.

Next, a refractive index distribution corresponding to the cross-section A-A' of FIG. 8 is shown in FIG. 9. FIG. 9 shows a stepwise refractive index distribution and the value at the horizontal portion is, for example, 2.0, 1.95, and 1.90 in a decreasing order. The refractive index of the bottom horizontal portion corresponds to the refractive index of the silicon oxide-based sidewall insulating film 19.

In association with this, the relationship between a nitrogen content of a silicon nitride-based insulating film and a refractive index is shown in FIG. 10. It is apparent from FIG. 10 that with an increase in the nitrogen content, the refractive index shows a substantially linear decrease.

Further, the relationship between a gas flow rate ratio in a typical CVD process (chemical vapor deposition) of a silicon nitride-based insulating film and a nitrogen composition ratio in the silicon nitride-based insulating film thus formed is shown in FIG. 11. As is apparent from FIG. 11, with an increase in the flow rate of a nitrogen-containing gas, the nitrogen composition ratio in the film shows a substantially linear increase. This suggests that a silicon nitride-based insulating film having an intended refractive index can be obtained by selecting a nitrogen content corresponding to the intended refractive index from FIG. 10, selecting a flow rate of a nitrogen-containing gas corresponding to the nitrogen content in FIG. 11, and then performing CVD.

3. Description on one example of a detailed device structure around the waveguide of the CMOS image sensor in the semiconductor integrated circuit device according to First Embodiment of the present application and the Outline of the manufacturing method related to it (mainly FIG. 12)

This section will describe one example of a detailed structure of mainly the upper half portion (a portion higher than the surface of the substrate) shown in FIG. 5 (almost every structure inside the semiconductor substrate was described above referring to FIG. 6 and the like so that this section will mainly describe a portion higher than the upper surface of the semiconductor substrate). The waveguide 10 was described above in detail referring to FIG. 7 so that a detailed description on this portion is not repeated in this section.

Figure 12:
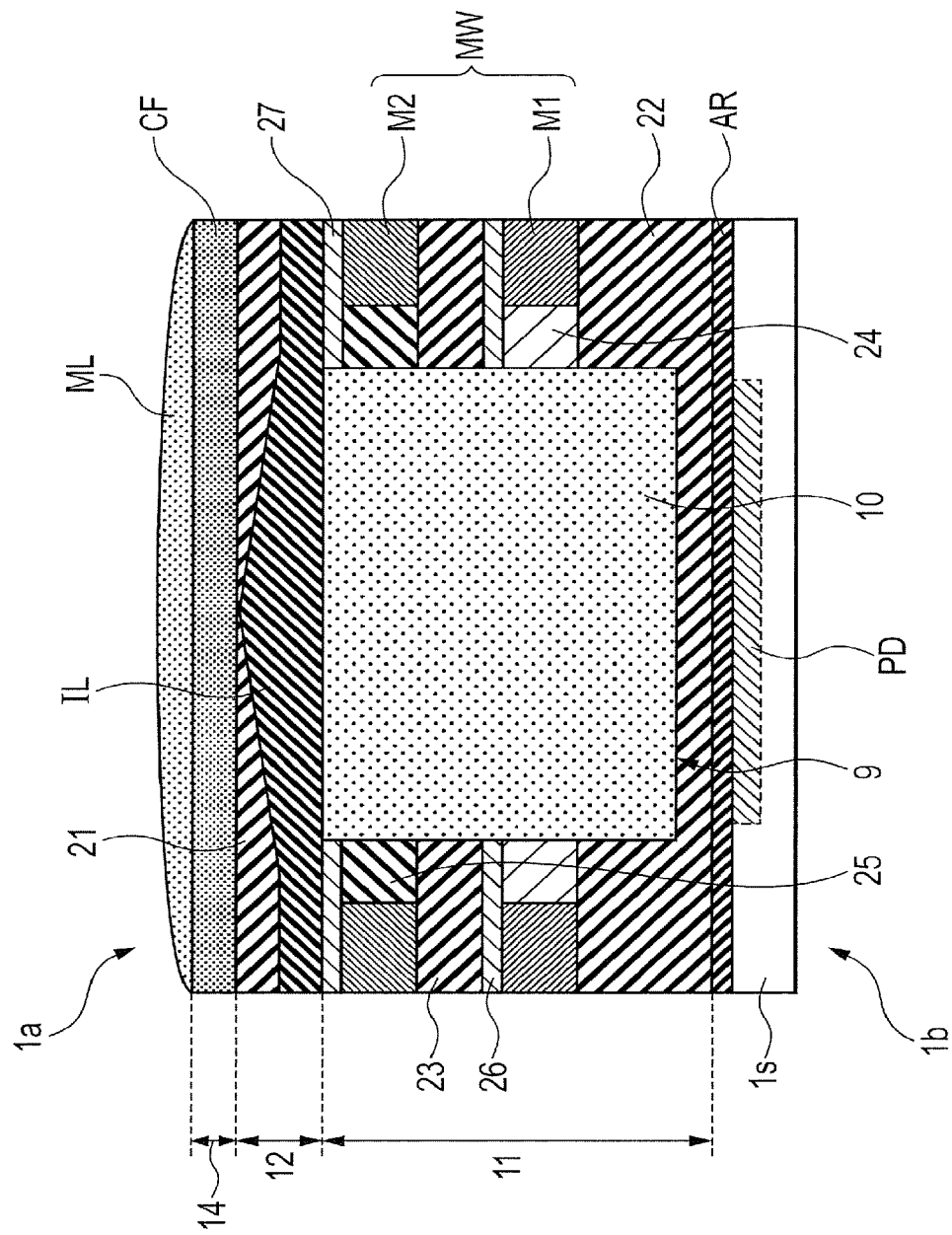
FIG. 12 is a detailed device cross-sectional view (an internal structure of the waveguide 10 is omitted therefrom) of a pixel region PX for describing one example of a detailed device structure around the waveguide of the CMOS image sensor in the semiconductor integrated circuit device according to First Embodiment of the present application and an outline of a manufacturing method related to the structure.

FIG. 12 is a detailed device cross-sectional view (an internal structure of the waveguide 10 is omitted therefrom) of a pixel region PX for describing one example of a detailed device structure around the waveguide of the CMOS image sensor in the semiconductor integrated circuit device according to First Embodiment of the present application and an outline of a manufacturing method related to the structure. Referring to this drawing, one example of a detailed device structure around the waveguide of the CMOS image sensor in the semiconductor integrated circuit device according to First Embodiment of the present application and an outline of a manufacturing method related to the structure will next be described.

One example of a detailed cross-sectional structure of the pixel region PX around the outside of the waveguide 10 of FIG. 5 is shown in FIG. 12. As shown in FIG. 12, the N type single crystal silicon substrate 1s has, in the surface region thereof on the side of the first main surface 1a, a photodiode PD. The N type single crystal silicon substrate 1s has, for example, on a substantially whole surface (for example, on a substantially whole surface of the photodiode array region DM of FIG. 1) of the first main surface 1a thereof, an anti-reflective film AR (having a thickness of, for example, about 90 nm).

The anti-reflective film AR has thereon a premetal insulating film 22 (having a thickness of, for example, about 250 nm) thicker than the anti-reflective film and made mainly of a silicon oxide-based insulating film. As the premetal insulating film 22, preferred is, for example, a HDP (high density plasma)-$SiO_2$ film.

The premetal insulating film 22 has thereon a silicon oxide-based insulating film 24 (having a thickness of, for example, about 100 nm) in first-layer wiring and it has, for example, a first-layer copper embedded wiring M1 obtained by embedding, for example, by a single damascene process. As the silicon oxide-based insulating film 24 in first-layer wiring, preferred is, for example, a P-TEOS (plasma-tetra-ethylorthosilicate)-$SiO_2$ film.

The silicon oxide-based insulating film 24 in first-layer wiring and the first-layer copper embedded wiring M1 have thereon, for example, a diffusion barrier insulating film 26 (having a thickness of, for example, about 30 nm) on first-layer wiring. As the diffusion barrier insulating film 26 on first-layer wiring, preferred is, for example, a SiCN film or the like.

The diffusion barrier insulating film 26 on first-layer wiring has thereon, for example, a silicon oxide-based insulating film 23 (having a thickness of, for example, about 70 nm) between wiring layers. As the silicon oxide-based insulating film 23 between wiring layers, preferred is, for example, a SiOC film or the like.

The silicon oxide-based insulating film 23 between wiring layers has thereon, for example, a silicon oxide-based insulating film 25 (having a thickness of, for example, about 120 nm) in second-layer wiring and it has therein a second-layer copper embedded wiring M2 obtained by a dual damascene process. As the silicon oxide-based insulating film 25 in second-layer wiring, preferred is, for example, a SiOC film or the like.

In this example, the multilayer wiring MW is comprised of these first-layer copper embedded wiring M1, the second-layer copper embedded wiring M2, and the like.

The silicon oxide-based insulating film 25 in second-layer wiring and the second-layer copper embedded wiring M2 have thereon, for example, a diffusion barrier insulating film 27 (having a thickness of, for example, about 30 nm) on second-layer wiring. As the diffusion barrier insulating film 27 on second-layer wiring, preferred is, for example, a SiCN film or the like.

Thus, in this example, the cross-section of the waveguide 10 extending from the surface of the diffusion barrier insulating film 27 on second-layer wiring to the middle of the premetal insulating film 22 (that is, the interlayer insulating film 11) is embedded in the waveguide holding hole 9 having a rectangular cross-section.

Further, the waveguide 10 and the diffusion barrier insulating film 27 on second-layer wiring have thereon, for example, an inner lens IL so that the optical axis thereof substantially coincides with the optical axis of the waveguide 10. The upper surface of the inner lens IL is planarized, for example, with a planarization insulating film 21. In this example, an inner lens layer 12 is comprised of the inner lens IL and the planarization insulating film 21. As a material of the inner lens layer 12, preferred is, for example, a silicon nitride-based insulating film.

A color filter layer 14 on the inner lens layer 12 has a color filter CF such as a red, blue, or green filter as needed. The color filter layer 14 has thereon a microlens ML, for example, so that the optical axis thereof substantially coincides with the optical axis of the waveguide 10.

4. Description on one example of an embedding process and the like of the waveguide holding hole of the CMOS image sensor in the semiconductor integrated circuit device according to First Embodiment of the present application (Mainly, from FIG. 13 to FIG. 21).

This section will describe one example of a process corresponding to the embedded structure of the waveguide holding hole 9 described in from Section 1 to Section 3. From FIG. 13 to FIG. 21 in this section, the anti-reflective film AR is omitted to show the example simply.

Figure 13:
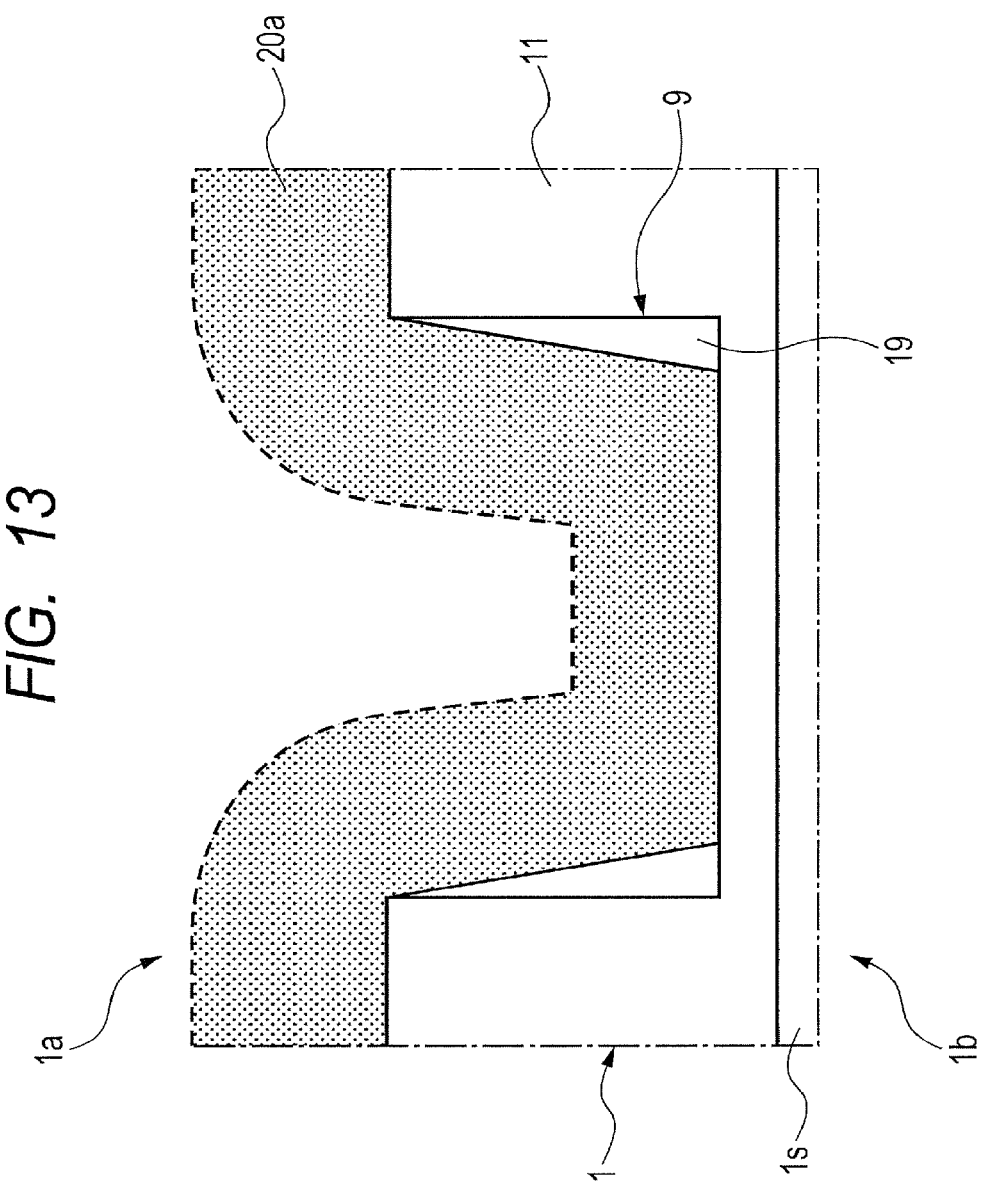
FIG. 13 is a schematic cross-sectional view of a device during manufacturing steps (from formation of a silicon oxide-based sidewall insulating film 19 to formation of a first silicon nitride-based insulating film 20a) of a waveguide holding hole and therearound for describing one example of an embedding process of the waveguide holding hole of the CMOS image sensor in the semiconductor integrated circuit device according to First Embodiment of the present application.
Figure 14:
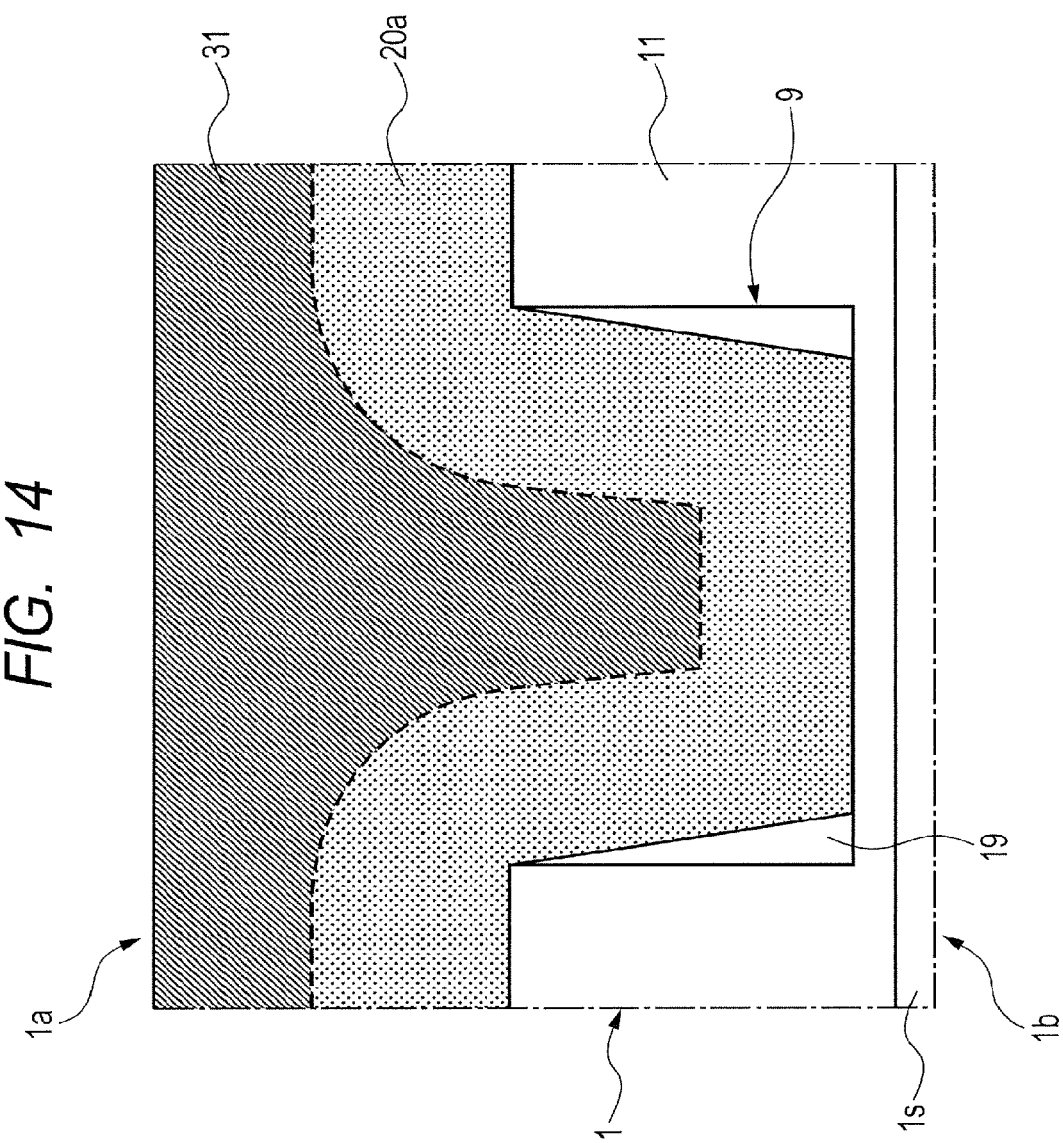
FIG. 14 is a schematic cross-sectional view of a device during a manufacturing step (a step of applying a gap filling material) of the waveguide holding hole and therearound for describing one example of an embedding process of the waveguide holding hole of the CMOS image sensor in the semiconductor integrated circuit device according to First Embodiment of the present application.
Figure 15:
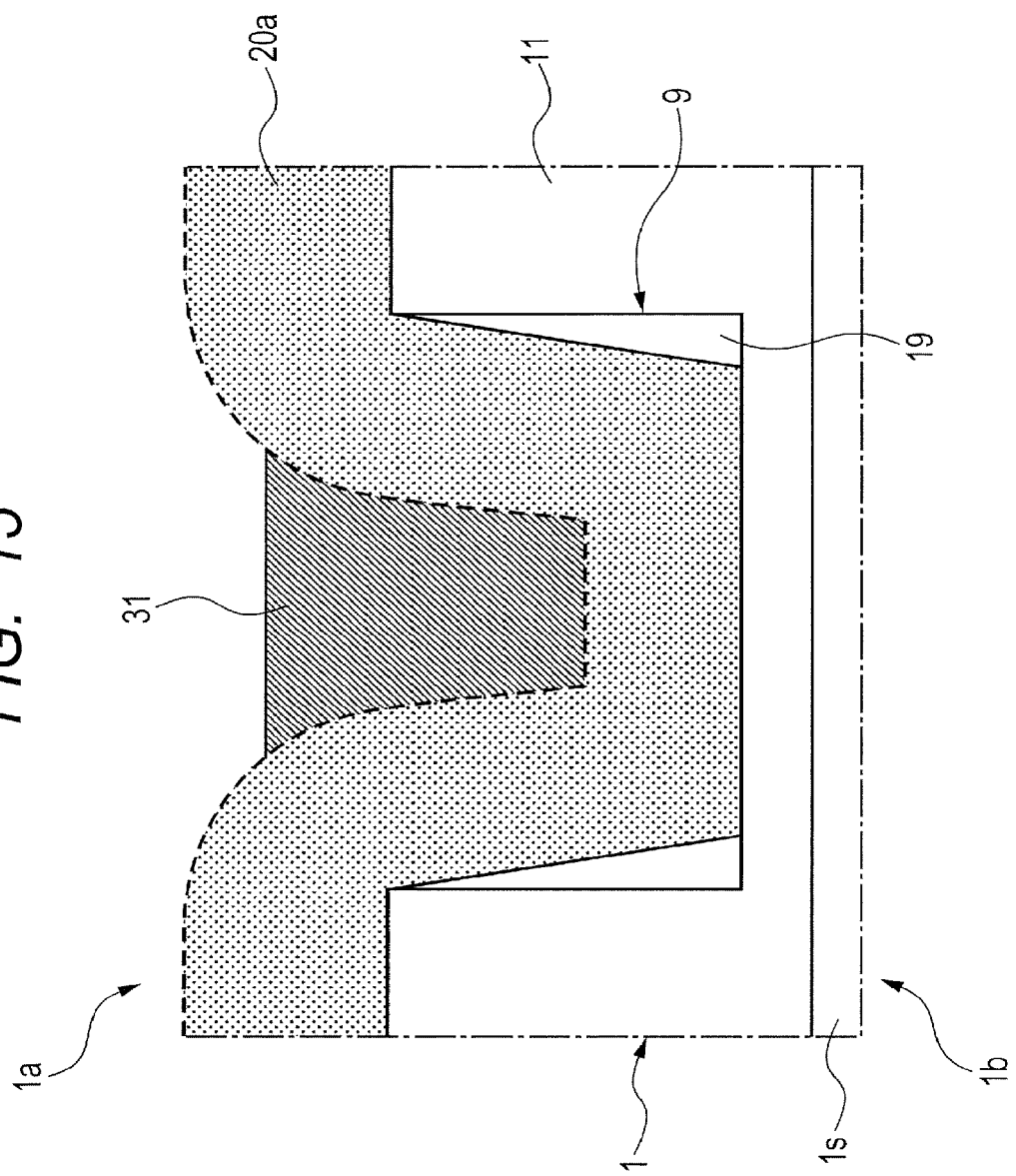
FIG. 15 is a schematic cross-sectional view of a device during a manufacturing step (a step of etching back the gap filling material) of the waveguide holding hole and therearound for describing one example of an embedding process of the waveguide holding hole of the CMOS image sensor in the semiconductor integrated circuit device according to First Embodiment of the present application.
Figure 16:
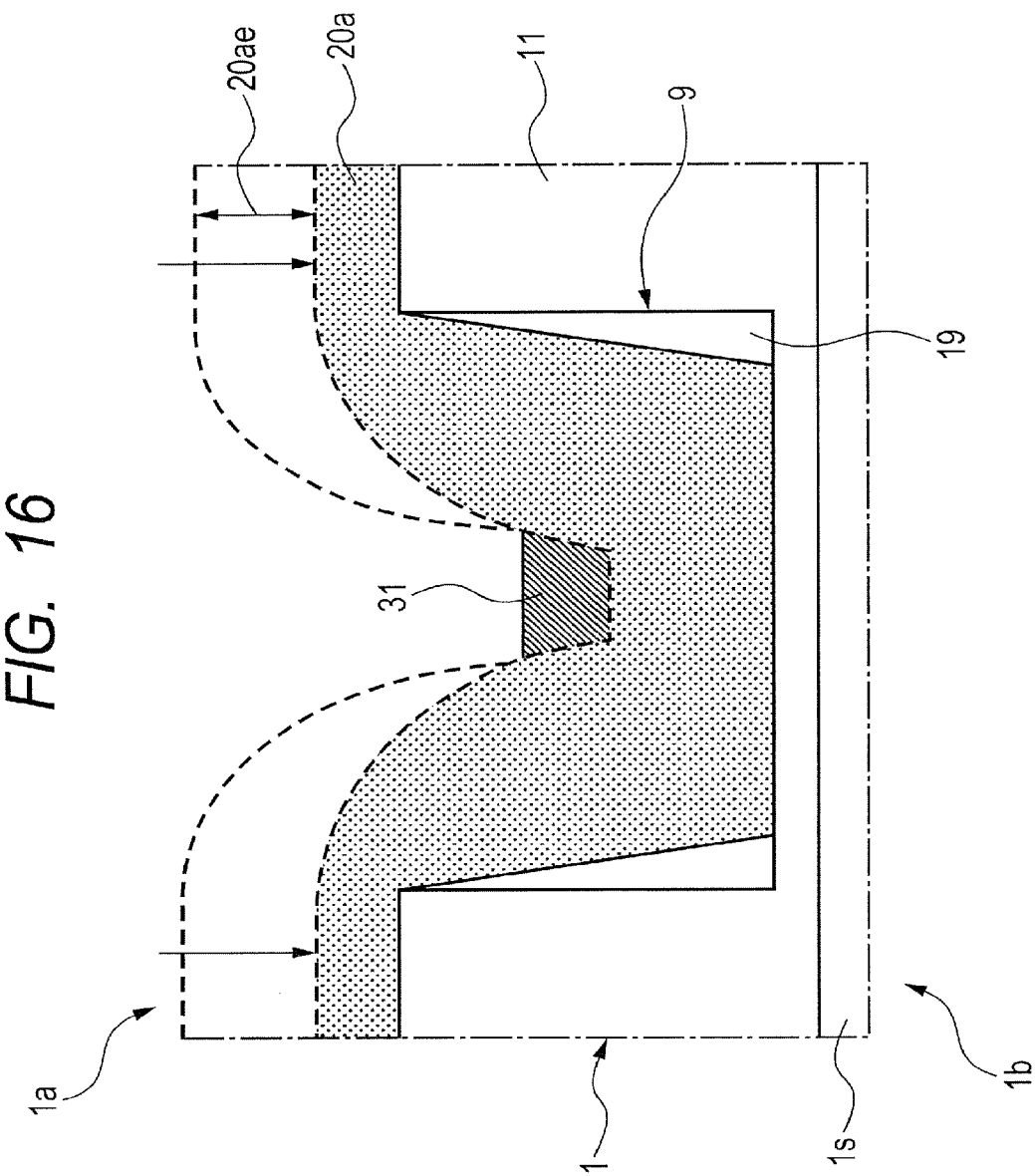
FIG. 16 is a schematic cross-sectional view of a device during a manufacturing step (a step of etching back the first silicon nitride-based insulating film 20a) of the waveguide holding hole and therearound for describing one example of an embedding process of the waveguide holding hole of the CMOS image sensor in the semiconductor integrated circuit device according to First Embodiment of the present application.
Figure 17:
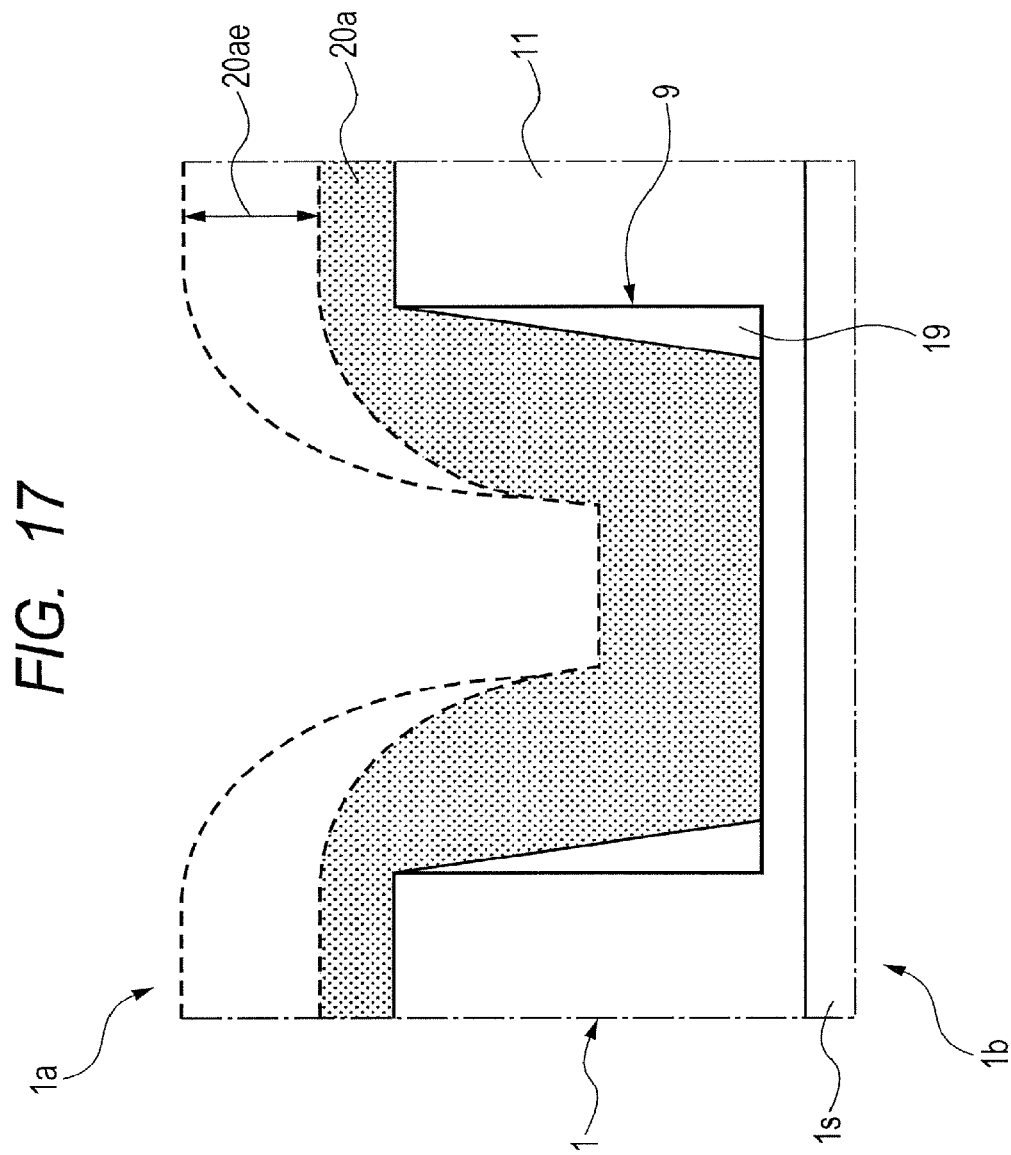
FIG. 17 is a schematic cross-sectional view of a device during a manufacturing step (a step of removing the gap filling material) of the waveguide holding hole and therearound for describing one example of an embedding process of the waveguide holding hole of the CMOS image sensor in the semiconductor integrated circuit device according to First Embodiment of the present application.
Figure 18:
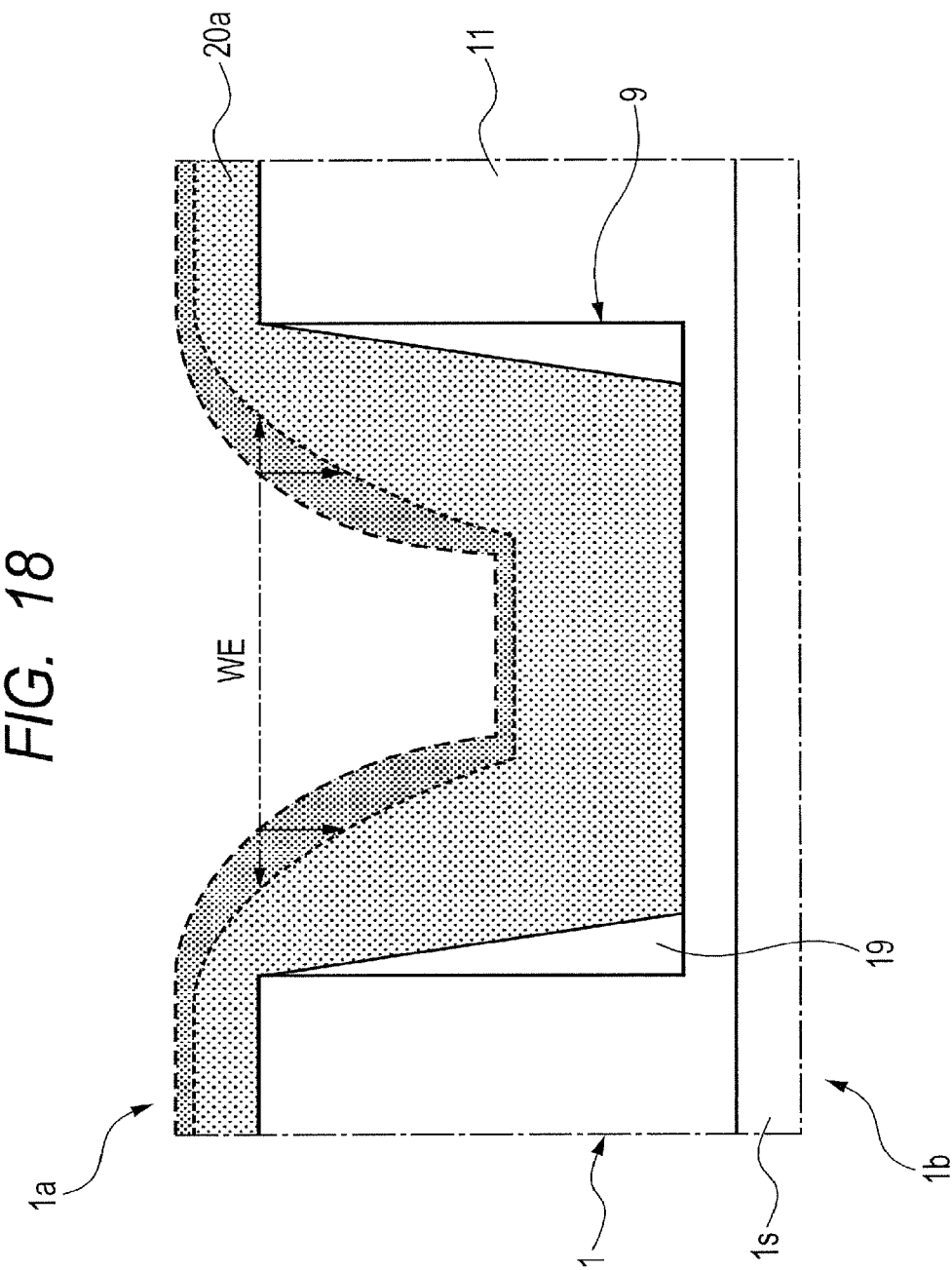
FIG. 18 is a schematic cross-sectional view of a device during a manufacturing step (a step of etching for widening the upper portion of the waveguide holding hole on the first silicon nitride-based insulating film 20a) of the waveguide holding hole and therearound for describing one example of an embedding process of the waveguide holding hole of the CMOS image sensor in the semiconductor integrated circuit device according to First Embodiment of the present application.
Figure 19:
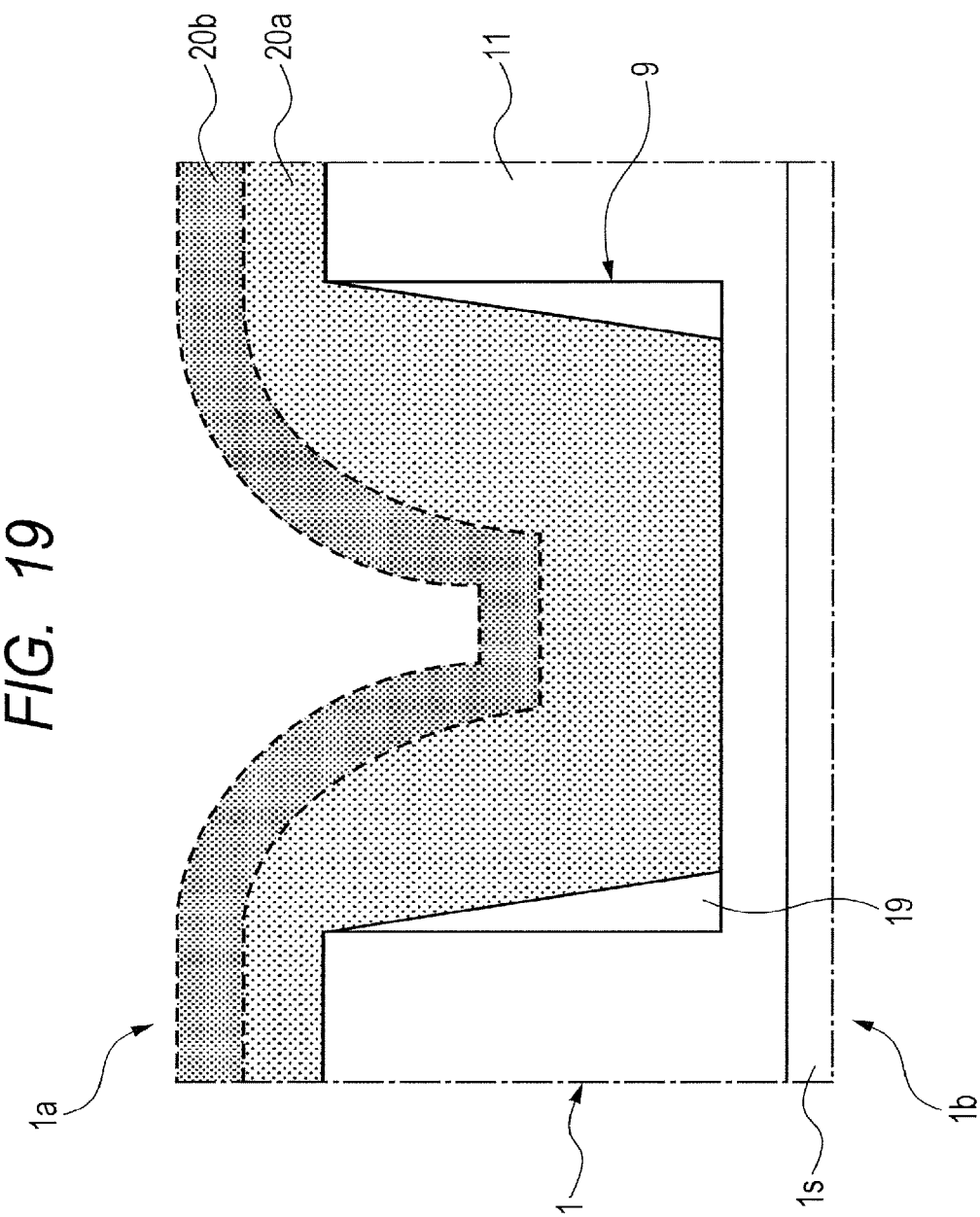
FIG. 19 is a schematic cross-sectional view of a device during a manufacturing step (a step of forming a second silicon nitride-based insulating film 20b) of the waveguide holding hole and therearound for describing one example of an embedding process of the waveguide holding hole of the CMOS image sensor in the semiconductor integrated circuit device according to First Embodiment of the present application.
Figure 20:
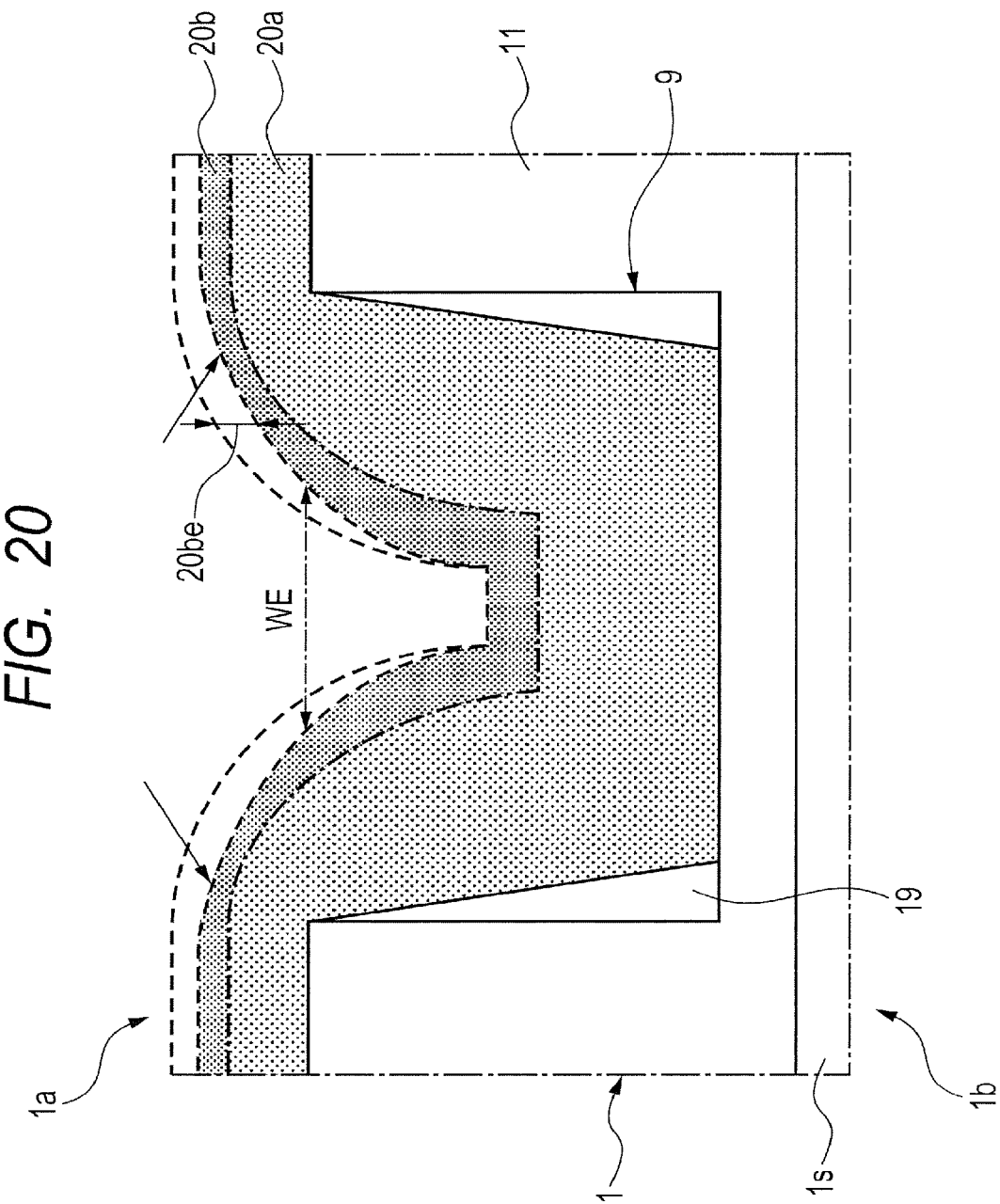
FIG. 20 is a schematic cross-sectional view of a device during a manufacturing step (a step of etching for widening the upper portion of the waveguide holding hole on the second silicon nitride-based insulating film 20b) of the waveguide holding hole and therearound for describing one example of an embedding process of the waveguide holding hole of the CMOS image sensor in the semiconductor integrated circuit device according to First Embodiment of the present application.
Figure 21:
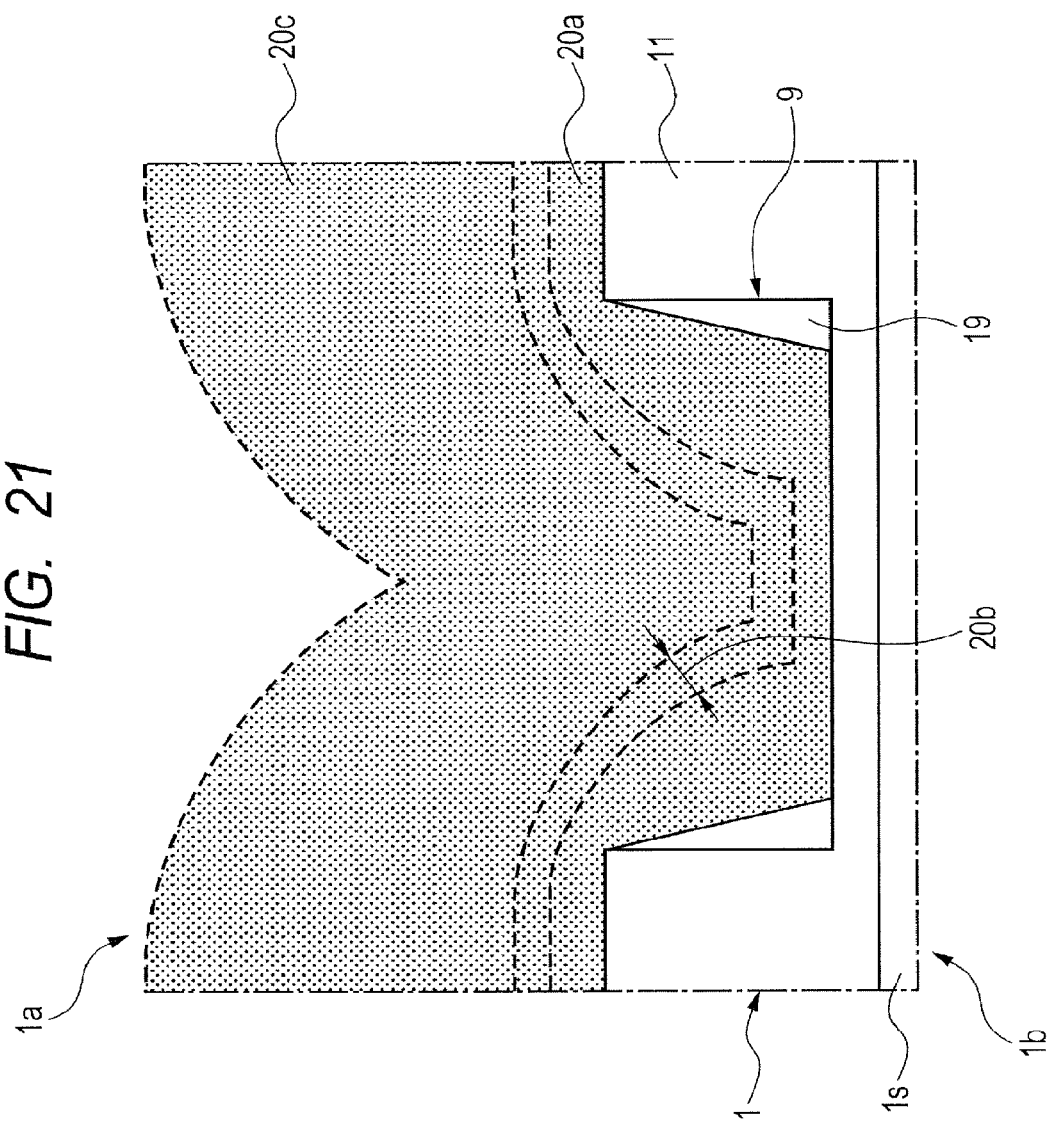
FIG. 21 is a schematic cross-sectional view of a device during a manufacturing step (step prior to a planarization step) of the waveguide holding hole and therearound for describing one example of an embedding process of the waveguide holding hole of the CMOS image sensor in the semiconductor integrated circuit device according to First Embodiment of the present application.

FIG. 13 is a schematic cross-sectional view of a device during manufacturing steps (from formation of a silicon oxide-based sidewall insulating film 19 to formation of a first silicon nitride-based insulating film 20a) of a waveguide holding hole and therearound for describing one example of an embedding process of the waveguide holding hole of the CMOS image sensor in the semiconductor integrated circuit device according to First Embodiment of the present application. FIG. 14 is a schematic cross-sectional view of a device during a manufacturing step (a step of applying a gap filling material) of the waveguide holding hole and therearound for describing one example of an embedding process of the waveguide holding hole of the CMOS image sensor in the semiconductor integrated circuit device according to First Embodiment of the present application. FIG. 15 is a schematic cross-sectional view of a device during a manufacturing step (a step of etching back the gap filling material) of the waveguide holding hole and therearound for describing one example of an embedding process of the waveguide holding hole of the CMOS image sensor in the semiconductor integrated circuit device according to First Embodiment of the present application. FIG. 16 is a schematic cross-sectional view of a device during a manufacturing step (a step of etching back the first silicon nitride-based insulating film 20*a*) of the waveguide holding hole and therearound for describing one example of an embedding process of the waveguide holding hole of the CMOS image sensor in the semiconductor integrated circuit device according to First Embodiment of the present application. FIG. 17 is a schematic cross-sectional view of a device during a manufacturing step (a, step of removing the gap filling material) of the waveguide holding hole and therearound for describing one example of an embedding process of the waveguide holding hole of the CMOS image sensor in the semiconductor integrated circuit device according to First Embodiment of the present application. FIG. 18 is a schematic cross-sectional view of a device during a manufacturing step (a step of etching for widening the upper portion of the waveguide holding hole on the first silicon nitride-based insulating film 20*a*) of the waveguide holding hole and therearound for describing one example of an embedding process of the waveguide holding hole of the CMOS image sensor in the semiconductor integrated circuit device according to First Embodiment of the present application. FIG. 19 is a schematic cross-sectional view of a device during a manufacturing step (a step of forming a second silicon nitride-based insulating film 20*b*) of the waveguide holding hole and therearound for describing one example of an embedding process of the waveguide holding hole of the CMOS image sensor in the semiconductor integrated circuit device according to First Embodiment of the present application. FIG. 20 is a schematic cross-sectional view of a device during a manufacturing step (a step of etching for widening the upper portion of the waveguide holding hole on the second silicon nitride-based insulating film 20*b*) of the waveguide holding hole and therearound for describing one example of an embedding process of the waveguide holding hole of the CMOS image sensor in the semiconductor integrated circuit device according to First Embodiment of the present application. FIG. 21 is a schematic cross-sectional view of a device during a manufacturing step (step prior to a planarization step) of the waveguide holding hole and therearound for describing one example of an embedding process of the waveguide holding hole of the CMOS image sensor in the semiconductor integrated circuit device according to First Embodiment of the present application. Referring to these drawings, one example of an embedding process of the waveguide holding hole of the CMOS image sensor in the semiconductor integrated circuit device according to First Embodiment of the present application will next be described.

First, as shown in FIG. 13, a waveguide holding hole 9 running from the surface side of the interlayer insulating film 11 to the inside thereof is formed by typical anisotropic dry etching (for example, with a fluorocarbon-based etching gas). Next, a silicon oxide film is formed using CVD or the like, followed by anisotropic etching to form a silicon oxide-based sidewall insulating film 19 along, for example, the whole sidewall 9*s* of the waveguide holding hole 9. Next, for example, plasma CVD is performed to form a first silicon nitride-based insulating film 20*a* (having a refractive index of, for example, about 1.90) having a film thickness of, for example, about 300 nm on a substantially whole surface of a wafer 1 on the side of the first main surface 1*a* including the inner surface of the waveguide holding hole 9.

Next, as shown in FIG. 14, a gap fill material 31 (for example, an organic gap fill material) is applied to a substantially whole surface of the wafer 1 on the side of the first main surface 1*a* to planarize the surface.

Next, as shown in FIG. 15, the gap fill material 31 is etched back, for example, by dry etching (for example, in an oxygen-based plasma atmosphere) to leave the gap fill material 31 in the waveguide holding hole 9 and at the same time, expose the surface of the first silicon nitride-based insulating film 20*a* outside the waveguide holding hole 9.

Next, as shown in FIG. 16, the first silicon nitride-based insulating film 20*a* is etched back, for example, by anisotropic dry etching (for example, with a fluorocarbon-based etching gas). This means that a portion 20*ae* to be etched is removed.

Next, as shown in FIG. 17, the gap fill material 31 (FIG. 16) which becomes unnecessary is removed from the whole surface, for example, by dry etching (for example, in an oxygen-based plasma atmosphere).

Next, as shown in FIG. 18, the surface of the first silicon nitride-based insulating film 20*a* is non-isotropically removed, for example, by anisotropic dry etching (for example, sputtering etching in an argon-based gas atmosphere) to widen a width WE of an unfilled portion in the vicinity of the upper end of the waveguide holding hole 9 (which will be called "first upper-end enlarging etching treatment).

Next, as shown in FIG. 19, a second silicon nitride-based insulating film 20*b* (having a refractive index of, for example, about 1.95) having a film thickness of about 200 nm is formed on a substantially whole surface of the first silicon nitride-based insulating film 20*a*, for example, by plasma CVD.

Next, as described above, as shown in FIG. 20, the surface of the second silicon nitride-based insulating film 20*b* is non-isotropically removed, for example, by anisotropic dry etching (for example, sputtering etching in an argon-based gas atmosphere) to widen the width WE of an unfilled portion in the vicinity of the upper end of the waveguide holding hole 9 (which will be called "second upper-end enlarging etching treatment). This means that a portion 20*be* of the second silicon nitride-based insulating film to be etched is removed.

Next, as shown in FIG. 21, a third silicon nitride-based insulating film 20*c* (having a refractive index of, for example, about 2.00) having a thickness of about 500 nm is formed on a substantially whole surface of the second silicon nitride-based insulating film 20*b*, for example, by plasma CVD to fill the waveguide holding hole 9 therewith. Next, a gap fill material similar to the gap fill material 31 is applied to a substantially whole surface of the wafer 1 on the side of the first main surface 1*a*. Next, etch back treatment by dry etching is performed until the first silicon nitride-based insulating film 20*a*, the second silicon nitride-based insulating film 20*b*, the third silicon nitride-based insulating film 20*c*, and the like outside the waveguide holding hole 9 are removed.

5. Description on Modification Example 1 (structure right above an anti-reflective film) with respect to a depth-direction range of a waveguide formation region of the CMOS image sensor in the semiconductor integrated circuit device according to First Embodiment of the present application (mainly, FIG. 22)

Figure 24:
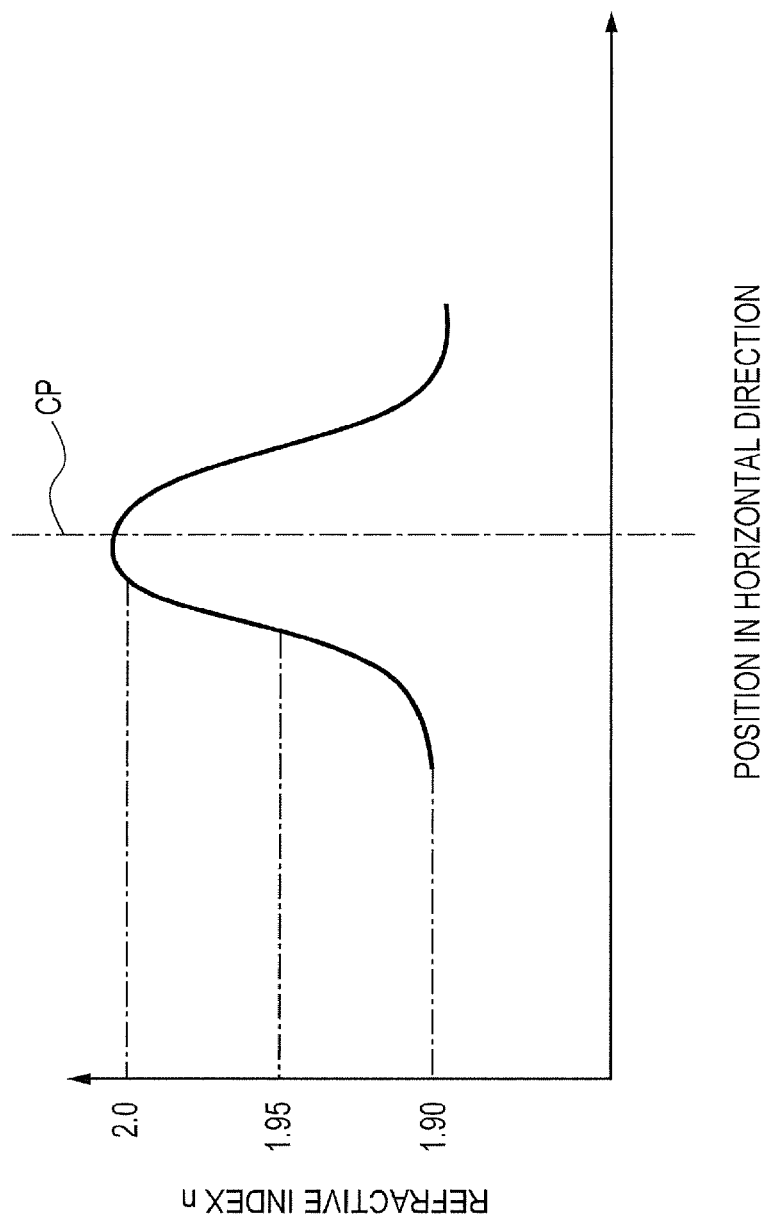
FIG. 24 is a distribution chart of a refractive index of the cross-section A-A' having the symmetry plane CP of FIG. 8 as a symmetry center, which chart is for describing a modification example of a refractive index distribution (continuous refractive index distribution system) with respect to the embedded structure of the waveguide holding hole of the CMOS image sensor in the semiconductor integrated circuit device according to First Embodiment of the present application.
Figure 25:
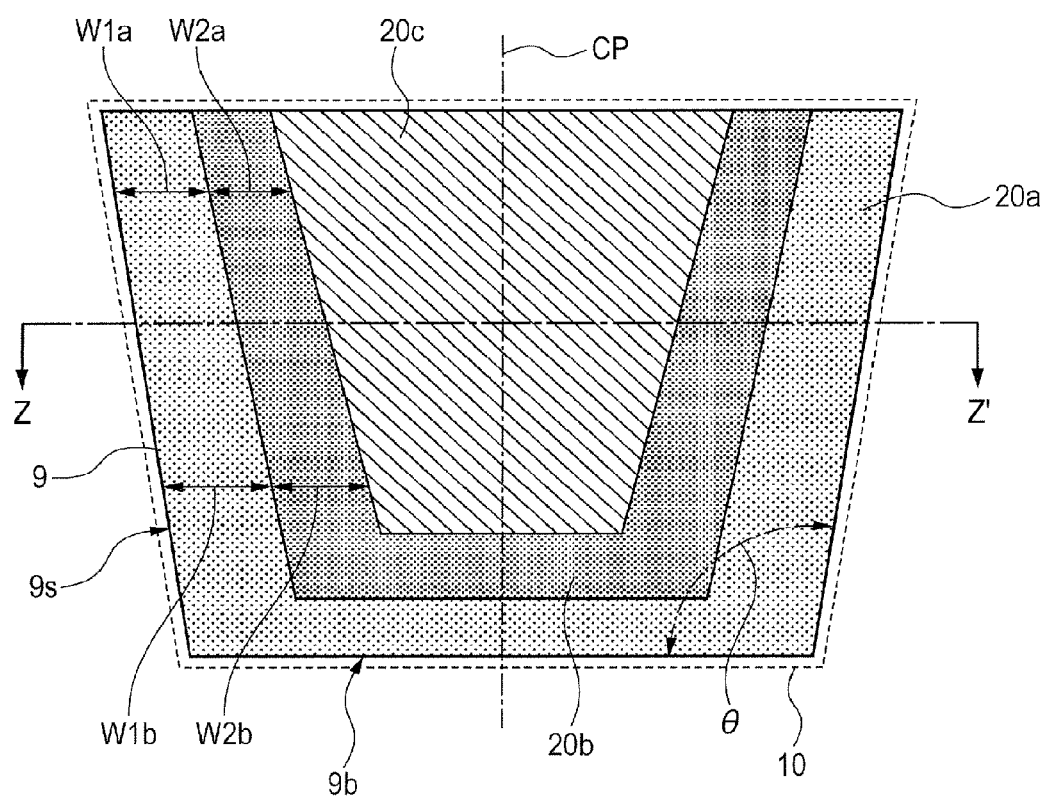
FIG. 25 is a detailed device fragmentary cross-sectional view of the waveguide 10 for describing a modification example (a forward tapered waveguide holding hole) with respect to the cross-sectional structure of the waveguide holding hole of the CMOS image sensor in the semiconductor integrated circuit device according to First Embodiment of the present application.
Figure 27:
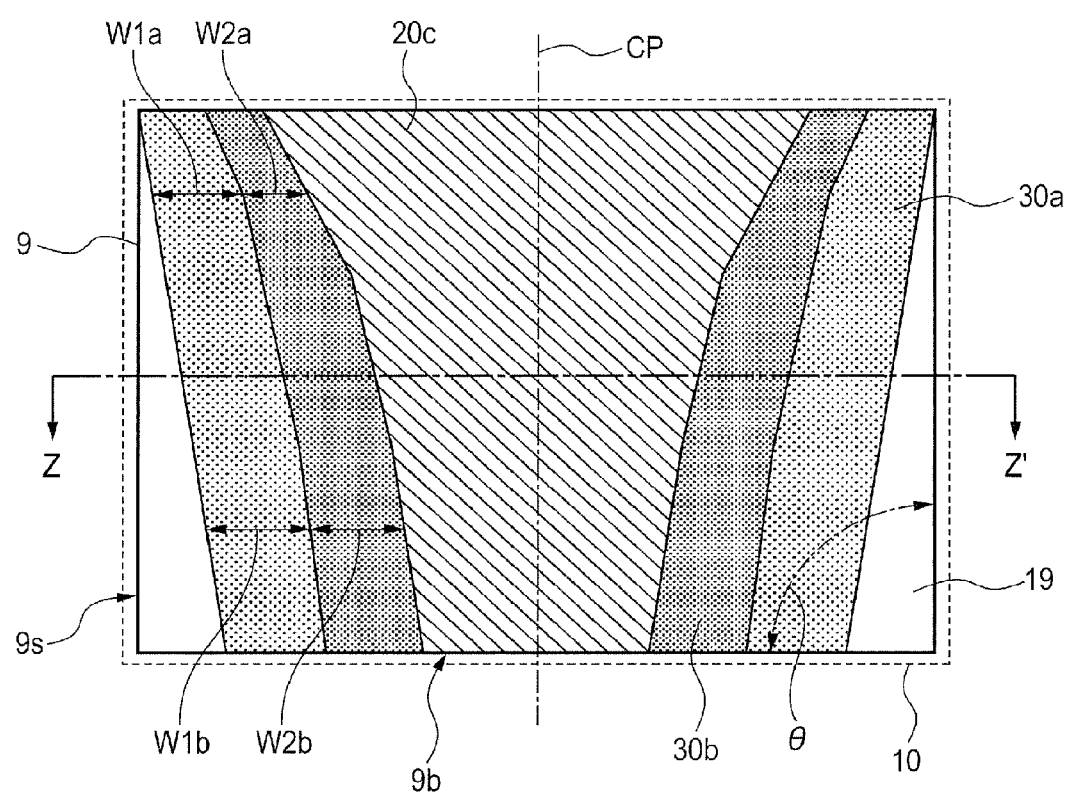
FIG. 27 is a detailed device fragmentary cross-sectional view of the waveguide 10 for describing Modification Example 1 (a rectangular waveguide holding hole with a silicon nitride-based sidewall) with respect to the embedded structure of the wavelength holding hole of the CMOS image sensor in the semiconductor integrated circuit device according to First Embodiment of the present application.
Figure 29:
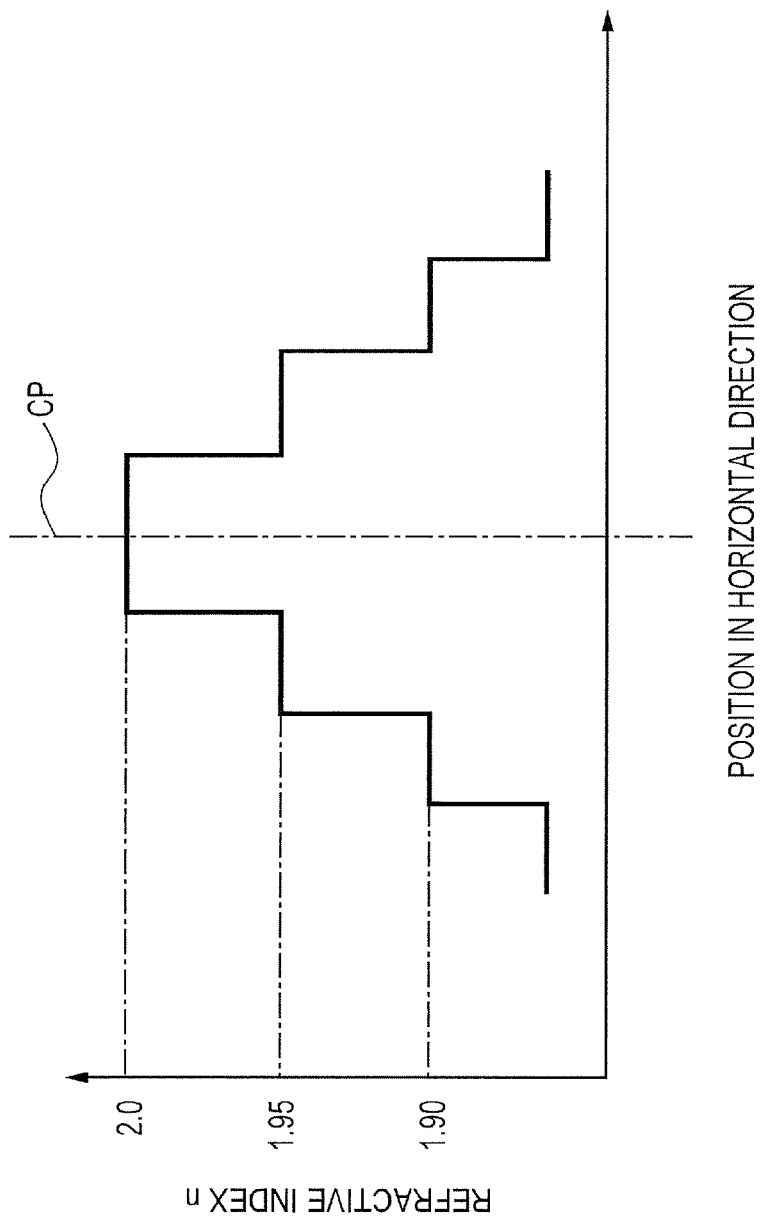
FIG. 29 is a distribution chart of a refractive index of the cross-section A-A' with the symmetry plane CP of FIG. 27 as a symmetry center.
Figure 30:
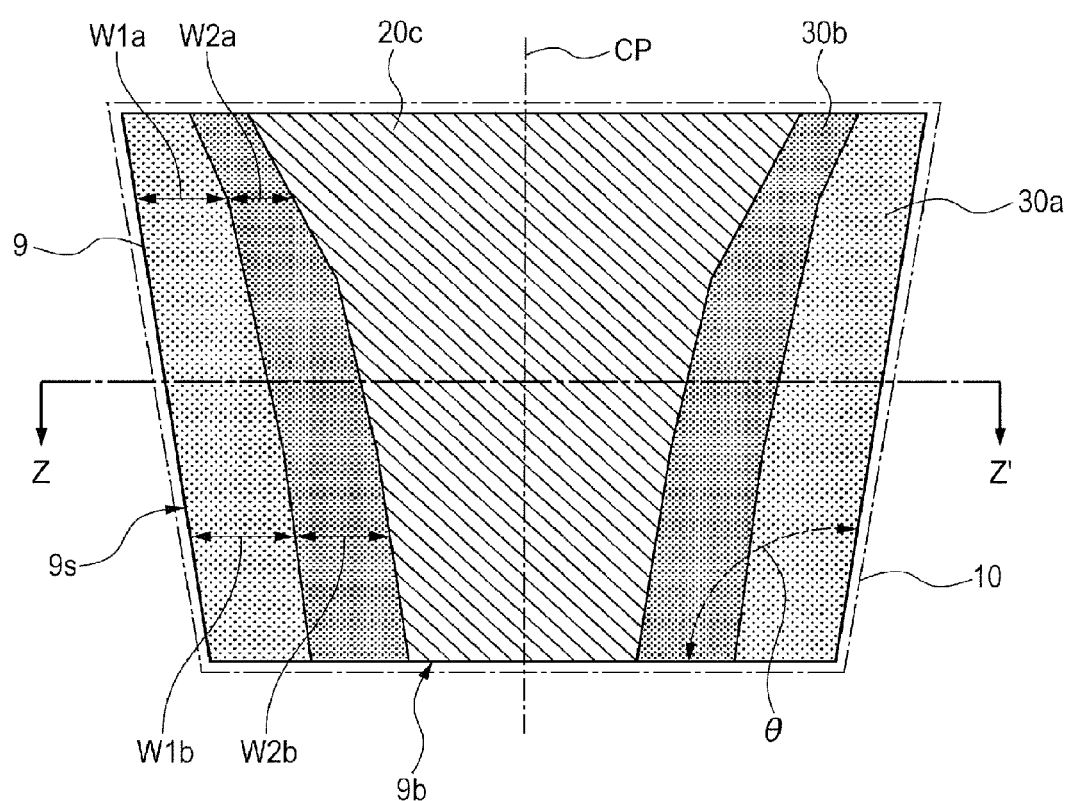
FIG. 30 is a detailed device fragmentary cross-sectional view of the waveguide 10 for describing Modification Example 2 (forward tapered waveguide holding, hole with a silicon nitride-based sidewall) with respect to the embedded structure of the waveguide holding hole of the CMOS image sensor in the semiconductor integrated circuit device according to First Embodiment of the present application.

This section will describe a modification example with respect to the cross-sectional structure shown in FIG. 5. To facilitate understanding of this drawing, a waveguide holding hole 9 having a rectangular cross-sectional structure will be described specifically as an example, but it is needless to say that the waveguide holding hole may be tapered, in other words, may be inverted trapezoidal. The waveguide 10 having a shape as shown in FIG. 7 and also the shape as shown in FIG. 25, FIG. 27, FIG. 30, or the like can be applied to the modification example. As well as the refractive index distribution in the waveguide 10 as shown in FIG. 9, the refractive index distribution as shown in FIG. 24 or FIG. 29 can be applied to the modification example.

Figure 22:
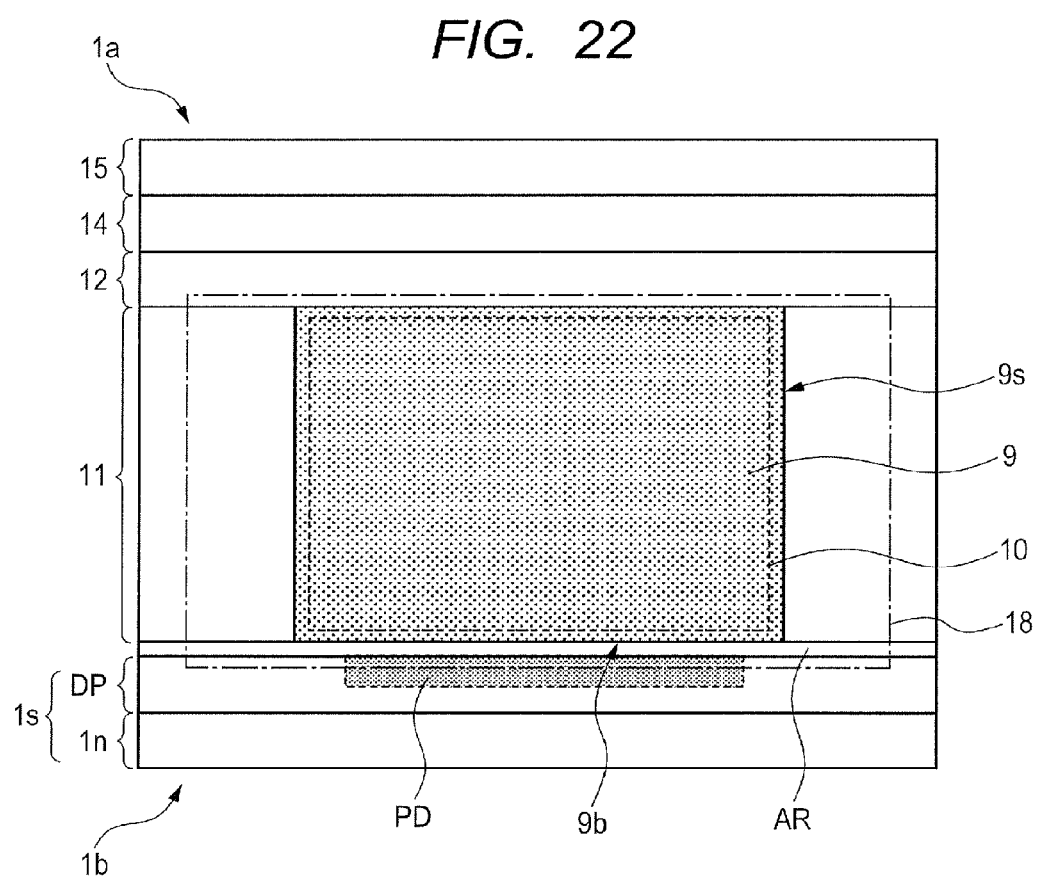
FIG. 22 is a chip cross-sectional view corresponding to the cross-section X-X' of FIG. 4 for describing Modification Example 1 (structure right above the anti-reflective film) with respect to a depth-direction range of a waveguide formation region of the CMOS image sensor in the semiconductor integrated circuit device according to First Embodiment of the present application.

FIG. 22 is a chip cross-sectional view corresponding to the cross-section X-X' of FIG. 4 for describing Modification Example 1 (structure right above the anti-reflective film) with respect to a depth-direction range of a waveguide formation region of the CMOS image sensor in the semiconductor integrated circuit device according to First Embodiment of the present application. Referring to this drawing, Modification example 1 (structure right above the anti-reflective film) with respect to a depth-direction range of a waveguide formation region of the CMOS image sensor in the semiconductor integrated circuit device according to First Embodiment of the present application will be described.

In this example, as shown in FIG. 22, the waveguide 10 (waveguide holding hole 9) reaches the lower end of the interlayer insulating film 11, that is, the upper surface of the anti-reflective film AR.

This structure makes it possible to reduce undesired reflection of a signal light compared with the case where the surface of the semiconductor substrate and the waveguide 10 have therebetween the interlayer insulating film 11. In this example, the waveguide 10 has the anti-reflective film AR right therebelow so that the anti-reflective film AR can be allowed to serve as an etching stop at the time of formation of the waveguide holding hole 9. Further, the anti-reflective film AR can reduce the damage to the semiconductor substrate at the time of forming the waveguide holding hole 9.

6. Description on Modification Example 2 (Structure right above the semiconductor substrate) with respect to a depth-direction range of a waveguide formation region of the CMOS image sensor in the semiconductor integrated circuit device according to First Embodiment of the present application (mainly, FIG. 23).

Similar to the above-described section, this section will describe a modification example with respect to the cross-sectional structure of FIG. 5. In order to facilitate understanding of the drawing, a waveguide holding hole 9 having a rectangular cross-sectional structure will be described specifically, but it is needless to say that it may be tapered, in other words, may be inverted trapezoidal. This modification example can be applied to, as well as the waveguide 10 having a shape as shown in FIG. 7, that having a shape as shown in FIG. 25, FIG. 27, FIG. 30, or the like. The modification example can also be applied to, as well as the waveguide 10 having a refractive index distribution as shown in FIG. 9, that having a refractive index distribution as shown in FIG. 24 or FIG. 29.

Figure 23:
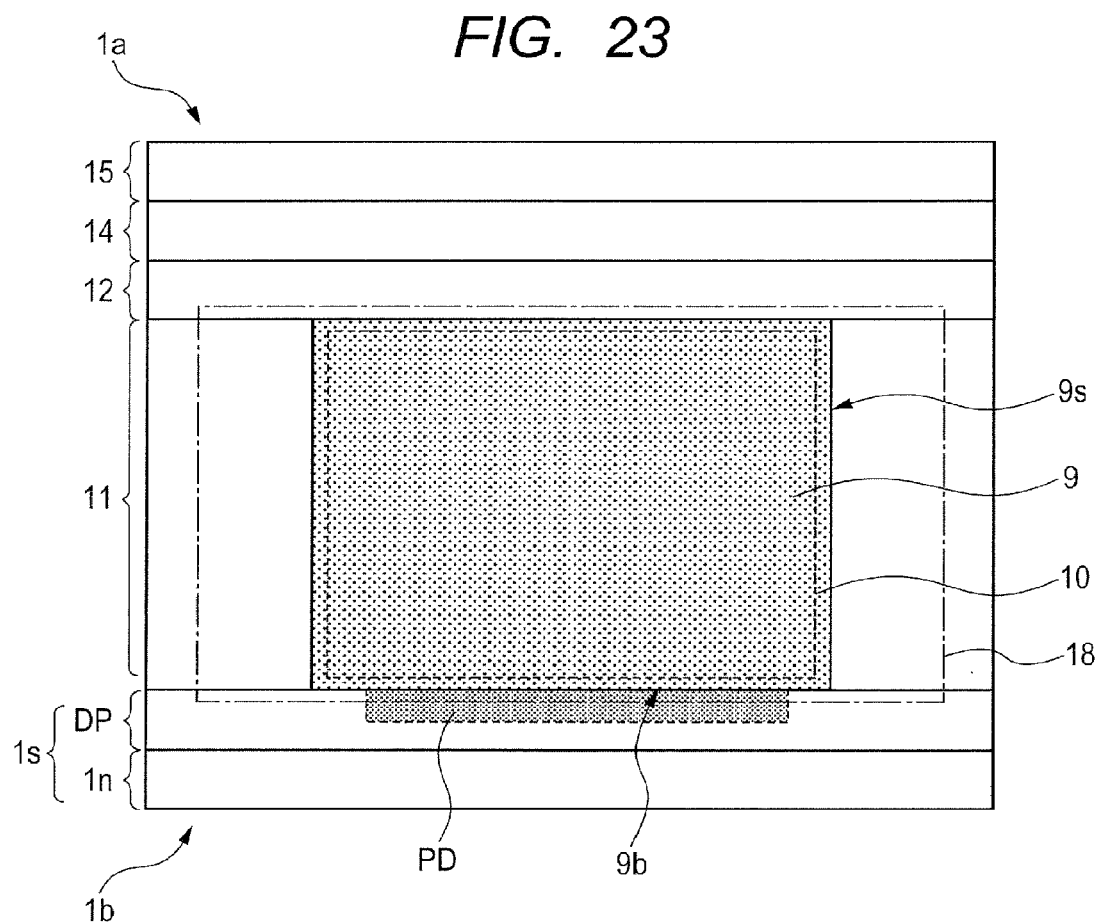
FIG. 23 is a chip cross-sectional view corresponding to the cross-section X-X' of FIG. 4 for describing Modification Example 2 (structure right above a semiconductor substrate) with respect to a depth-direction range of a waveguide formation region of the CMOS image sensor in the semiconductor integrated circuit device according to First Embodiment of the present application.

FIG. 23 is a chip cross-sectional view corresponding to the cross-section X-X' of FIG. 4 for describing Modification Example 2 (structure right above a semiconductor substrate) with respect to a depth-direction range of a waveguide formation region of the CMOS image sensor in the semiconductor integrated circuit device according to First Embodiment of the present application. Referring to this drawing, Modification Example 2 (structure right above a semiconductor substrate) with respect to a depth-direction range of a waveguide formation region of the CMOS image sensor in the semiconductor integrated circuit device according to First Embodiment of the present application will be described.

In this example, as shown in FIG. 23, the anti-reflective film AR, that is, the lower end of the interlayer insulating film 11 is removed from below the waveguide 10 (waveguide holding hole 9) so that the waveguide 10 (waveguide holding hole 9) reaches the upper surface 1a of the N type single crystal silicon substrate 1s (semiconductor substrate).

This makes it possible to reduce undesired reflection or the like of a signal light compared with the case where the surface of the semiconductor substrate and the waveguide 10 have therebetween the anti-reflective film AR.

Similar to the description given above referring to FIG. 22, during formation of the waveguide holding hole 9, the anti-reflective film AR is allowed to serve as an etching stopper to stop etching once. The anti-reflective film AR is removed thereafter. Compared with the formation of the waveguide holding hole 9 only by single etching treatment, therefore, damage to the substrate 1s can be reduced.

7. Description on Modification Example (continuous refractive index distribution system) of refractive index distribution with respect to the embedded structure of the waveguide holding hole of the CMOS image sensor in the semiconductor integrated circuit device according to First Embodiment of the present application (mainly, FIG. 24)

This section will describe a modification example of the refractive index distribution of FIG. 9, taking the structure of FIG. 7 as an example. This refractive index distribution can be applied substantially as is not only to the structure shown in FIG. 7 but also that shown in FIG. 25, FIG. 27, FIG. 30, or the like.

FIG. 24 is a distribution chart of a refractive index of the cross-section A-A' having the symmetry plane CP of FIG. 8 as a symmetry center, which chart is for describing a modification example of a refractive index distribution (continuous refractive index distribution system) with respect to the embedded structure of the waveguide holding hole of the CMOS image sensor in the semiconductor integrated circuit device according to First Embodiment of the present application. Referring to this chart, modification example (continuous refractive index distribution system) of a refractive index distribution with respect to the embedded structure of the waveguide holding hole of the CMOS image sensor in the semiconductor integrated circuit device according to First Embodiment of the present application will next be described.

In this example, different from FIG. 9, the distribution of a refractive index shows a continuous change as shown in FIG. 24.

By this distribution, a wavefront running vertically downward at the center of the waveguide 10 can be made into a continuous and wide-width plane with high precision, leading to minimized scattering.

The "continuous change" can be caused not only by actual continuous change but also by using a multilayer film instead. For example, when the process from FIG. 13 to FIG. 21 is taken as an example, it is possible to configure each of the first silicon nitride-based insulating film 20a, the second silicon nitride-based insulating film 20b, and the third silicon nitride-based insulating film 20c (embedded silicon nitride-based insulating film) as a film of two or more layers (for example, a three layer film), thereby differentiating their refractive indexes (the film formed later has a higher refractive index). Thus, by forming each of the constituent films as a multilayer film, it is possible to avoid the difficulty of the continuous refractive-index changing process by continuous film formation. This completely applies to the structure of FIG. 25 and also applies to the sidewall structure shown in FIGS. 27 and 30.

8. Description on a modification example (forward tapered waveguide holding hole) with respect to the cross-sectional structure of the waveguide holding hole of the CMOS image sensor in the semiconductor integrated circuit device according to First Embodiment of the present application (mainly, FIGS. 25 and 26)

This section will describe a modification example of FIG. 7, while taking the peripheral structure shown in FIG. 5 as an example. It is needless to say that the structure described herein is not limited to the peripheral structure shown in FIG. 5 but can be applied as is to the peripheral structure shown in FIGS. 22 and 23.

Figure 26:
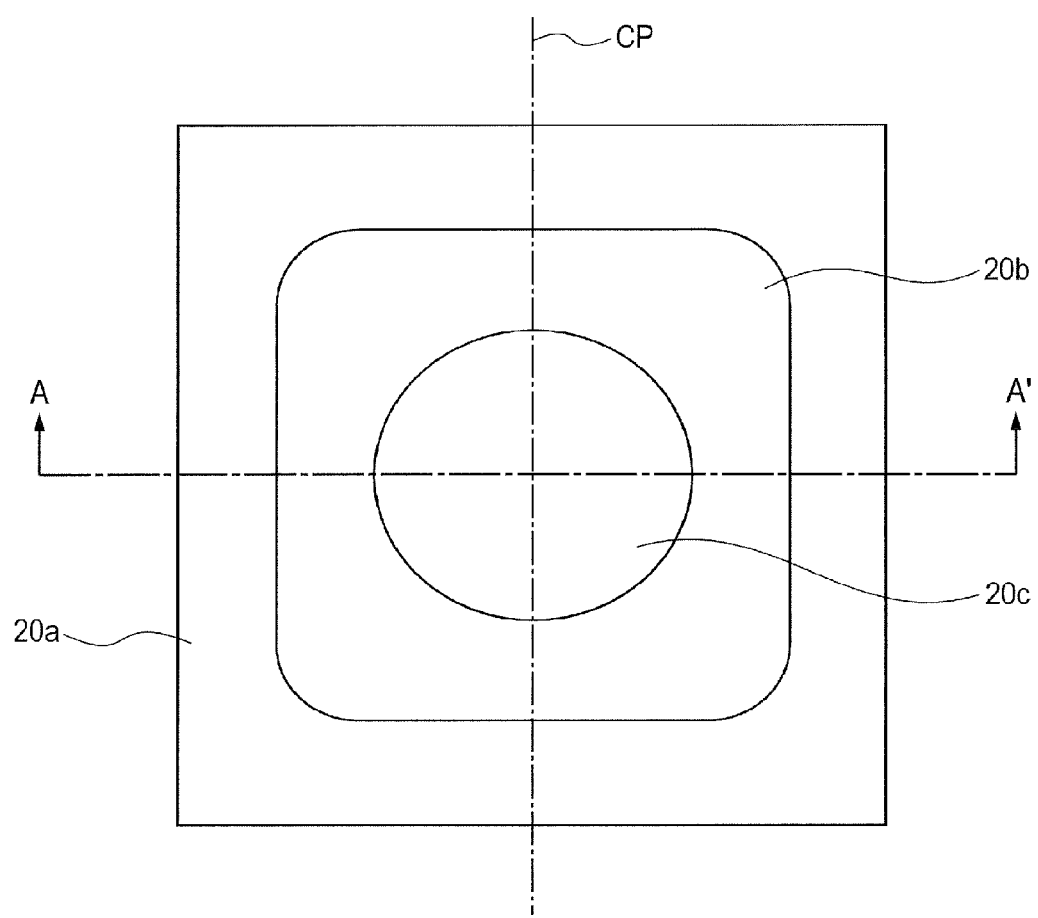
FIG. 26 is a cross-sectional view of the horizontal cross-section Z-Z' corresponding to a bisector plane, in the depth direction, of the third silicon nitride-based insulating film 20c of FIG. 25.

FIG. 25 is a detailed device fragmentary cross-sectional view of the waveguide 10 for describing a modification example (a forward tapered waveguide holding hole) with respect to the cross-sectional structure of the waveguide holding hole of the CMOS image sensor in the semiconductor integrated circuit device according to First Embodiment of the present application. FIG. 26 is a cross-sectional view of the horizontal cross-section Z-Z' corresponding to a bisector plane, in the depth direction, of the third silicon nitride-based insulating film 20c of FIG. 25. Referring to these drawings, a modification example (a forward tapered waveguide holding hole) with respect to the cross-sectional structure of the waveguide holding hole of the CMOS image sensor in the semiconductor integrated circuit device according to First Embodiment of the present application will next be described.

In this example, different from FIGS. 7 and 8, the waveguide holding hole 9 does not have the silicon oxide-based sidewall insulating film 19 but has, in itself, an inverted trapezoidal cross-sectional shape as shown in FIGS. 25 and 26. It is needless to say that similar to FIG. 7, the waveguide holding hole may have the silicon oxide-based sidewall insulating film 19.

It is possible to obtain an effect similar to that of FIG. 7 by a simple structure without a sidewall insulating film, more specifically, by forming the sidewall 9s of the waveguide holding hole 9 itself with an inclination.

A preferred range of the internal angle θ of the sidewall is, for example, 97°<(internal angle θ)≤103°. The internal angle θ may exceed the upper limit, but such internal angles are disadvantageous for sizing down of the pixel region PX. On the other hand, the lower limit is determined by the definition of "vertical". Excessively small inclination from a vertical position cannot produce a marked inclination effect.

9. Description on Modification Example 1 (a rectangular waveguide holding hole with a silicon nitride-based sidewall) with respect to the embedded structure of the waveguide holding hole of the CMOS image sensor in the semiconductor integrated circuit device according to First Embodiment of the present application (mainly, FIGS. 27 to 29)

Similar to above-mentioned section, this section will describe a modification example of FIG. 7, while taking the peripheral structure of FIG. 5 as an example. It is needless to say that the structure described herein is not limited to the peripheral structure of FIG. 5 but can be applied as is to the peripheral structure of FIGS. 22 and 23.

Figure 28:
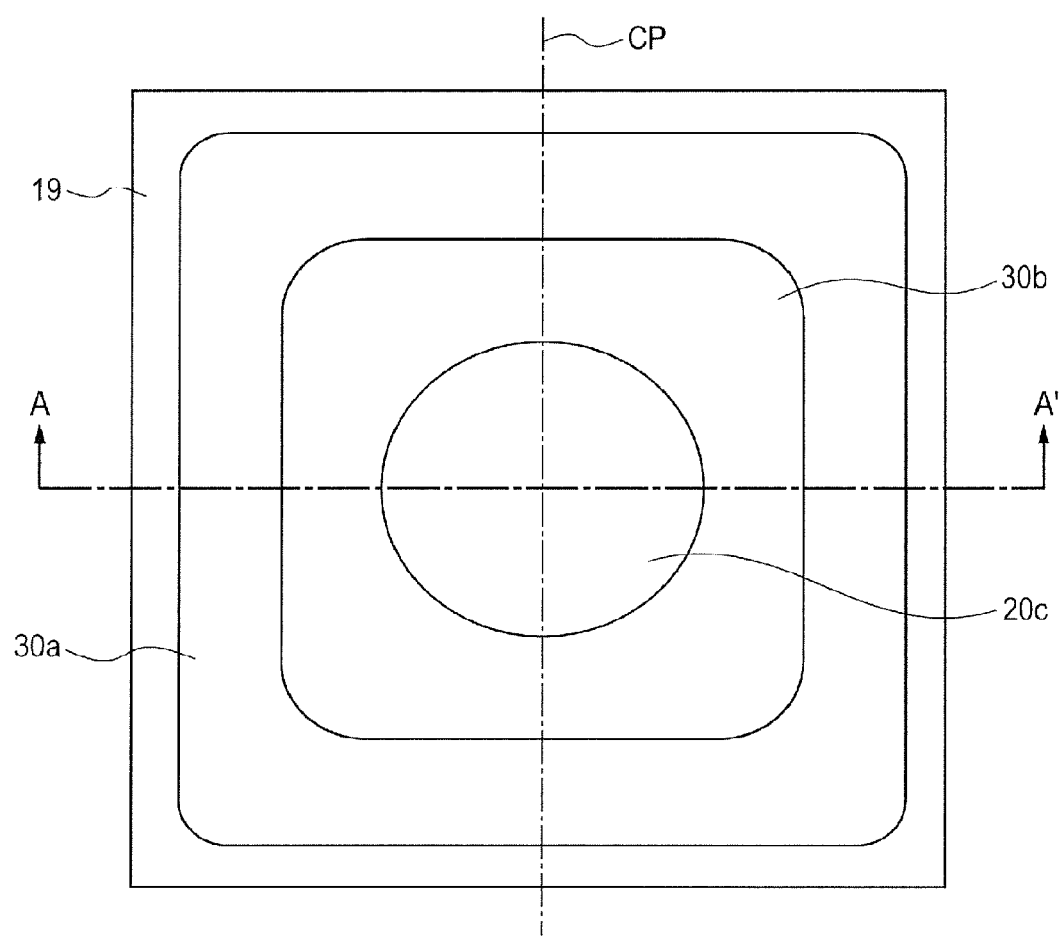
FIG. 28 is a cross-sectional view of the horizontal cross-section Z-Z' corresponding to a bisector plane, in the depth direction, of the third silicon nitride-based insulating film 20c of FIG. 27.

FIG. 27 is a detailed device fragmentary cross-sectional view of the waveguide 10 for describing Modification Example 1 (a rectangular waveguide holding hole with a silicon nitride-based sidewall) with respect to the embedded structure of the waveguide holding hole of the CMOS image sensor in the semiconductor integrated circuit device according to First Embodiment of the present application. FIG. 28 is a cross-sectional view of the horizontal cross-section Z-Z' corresponding to a bisector plane, in the depth direction, of the third silicon nitride-based insulating film 20c of FIG. 27. FIG. 29 is a distribution chart of a refractive index of the cross-section A-A' having the symmetry plane CP of FIG. 27 as a symmetry center. Referring to these drawings, Modification Example 1 (a rectangular waveguide holding hole with a silicon nitride-based sidewall) with respect to the embedded structure of the waveguide holding hole of the CMOS image sensor in the semiconductor integrated circuit device according to First Embodiment of the present application will next be described.

In this example, as shown in FIGS. 27 and 28, similar to FIG. 7, the internal angle of the sidewall is substantially 90°. Further, the waveguide holding hole 9 has, at the peripheral portion contiguous to the sidewall 9s thereof, for example, a silicon oxide-based sidewall insulating film 19 and this silicon oxide-based sidewall insulating film 19 has, along the side surface thereof and, for example, over the entire circumference thereof, a first silicon nitride-based sidewall insulating film 30a. Further, this first silicon nitride-based sidewall insulating film 30a has, along the side surface thereof, and for example, over the entire circumference thereof, second silicon nitride-based sidewall insulating film 30b. In a portion which has remained unfilled, a third silicon nitride-based insulating film 20c is embedded.

Since such a structure does not need a horizontal portion (a portion lower than the lower end portion of the embedded silicon nitride-based insulating film 20c) of the silicon nitride-based insulating film at the lower half portion of the waveguide 10 as shown in FIG. 7, attenuation or reflection of a signal light at that portion can be reduced.

In addition, this example has the advantage that since the structure of the sidewall smoothly becomes wider at the lower portion, which will be described below in detail, facilitates process control.

In this example, the width W1a of the upper portion of the first silicon nitride-based sidewall insulating film 30a is smaller than the width W1b at the lower portion thereof. The term "width of the upper portion" as used herein means a horizontally measured thickness of a film portion which is higher than half of the depth of the waveguide holding hole 9 and further, higher than half of the depth of the upper half portion. The term "width of the lower portion", on the other hand, means a horizontally measured thickness of a film portion which is lower than half of the depth of the waveguide holding hole 9 and further, lower than half of the depth of the lower half portion.

Similarly, the width W2a of the upper portion of the second silicon nitride-based sidewall insulating film 30b is smaller than the width W2b of the lower portion thereof.

By setting the width of these insulating films as described above, an effect similar to that produced by the sidewall structure which is wider at the lower portion as described referring to FIG. 7 can be obtained.

The refractive index distribution is, as shown in FIG. 29, exactly the same as that of FIG. 9.

10. Description on Modification Example 2 (forward tapered waveguide holding hole with a silicon nitride-based sidewall) with respect to the embedded structure of the waveguide holding hole of the CMOS image sensor according to First Embodiment of the present application (mainly, FIG. 30)

Similar to the above-mentioned section, this section will describe a modification example of FIG. 7, while taking the peripheral structure of FIG. 5 as an example. It is needless to say that the structure described herein is not limited to the peripheral structure of FIG. 5, but can be applied as is to the peripheral structure shown in FIGS. 22 and 23.

FIG. 30 is a detailed device fragmentary cross-sectional view of the waveguide 10 for describing Modification Example 2 (forward tapered waveguide holding hole with a silicon nitride-based sidewall) with respect to the embedded structure of the waveguide holding hole of the CMOS image sensor in the semiconductor integrated circuit device according to First Embodiment of the present application. Referring to this drawing, Modification Example 2 (forward tapered waveguide holding hole with a silicon nitride-based sidewall) with respect to the embedded structure of the waveguide holding hole of the CMOS image sensor in the semiconductor integrated circuit device according to First Embodiment of the present application will next be described.

In this example, as shown in FIG. 30, a multiple sidewall structure analogous to that of FIG. 27 is applied to a tapered waveguide holding hole 9 similar to that shown in FIG. 25. This means that the waveguide holding hole 9 of FIG. 25 having an inverted trapezoidal cross-sectional shape is used instead of the silicon oxide-based sidewall insulating film 19 of FIG. 27.

By using such a structure, an advantage similar to that produced by the example described in Section 9 can be produced without using the silicon oxide-based sidewall insulating film 19. This example therefore enables a simple structure and easy manufacture.

It is needless to say that this example does not exclude the use of the silicon oxide-based sidewall insulating film 19.

11. Complementary description on the above-mentioned embodiment (and modification examples) and general consideration (mainly, FIG. 31)

FIG. 31 is a schematic cross-sectional view of a chip corresponding to the cross-section X-X' of FIG. 4 for describing the summary of First Embodiment corresponding to FIG. 5 (partially, FIG. 7 or FIG. 12). Referring to this drawing, a complementary description on the above-mentioned embodiment (and modification examples) and general consideration will next be performed.

(1) Consideration and Complementary Description on Technical Problems

The dimension of current pixel regions is becoming an equal level (for example, up to several times the wavelength) or smaller than the intended light wavelength (a region of this dimension is called "wave zone"). Even if a waveguide or various additional lenses are introduced, it is still difficult to effectively focus light as a wave only around the center portion of a photodiode only by such introduction.

Described specifically, from the standpoint of geometric optics, even if an external optical system with a microlens or inner lens is used to focus light on the center of each photodiode, light travels while spreading throughout the substantially whole surface of the waveguide because the wavefront has a spread comparable to the wavelength. By scattering of light near the waveguide or the like, leakage occurs in adjacent pixel regions, causing crosstalk or the like.

In order to eliminate such undesired spread of a signal light in the waveguide, it is effective to introduce a light focusing structure (which will be called "simple center-high-refractive-index structure") in which the refractive index is higher on the center side with the central optical axis of the waveguide as a center and the refractive index shows a stepwise or continuous decreases radially from the center.

The investigation by the present inventors has however revealed that in a wave zone, light travels more straight as the area of the wavefront perpendicular to the traveling direction is larger, but in the simple center-high-refractive-index structure, the wavefront curves due to a difference in light velocity between center and periphery and scattering occurs based on Huygens' principle, leading to spreading of wave packets.

(2) Description on the Summary of First Embodiment (Mainly, FIG. 31)

To overcome such a problem, First Embodiment employs the following structure.

First, a basic configuration is described. As shown in FIG. 31, a semiconductor substrate 1$s$ in each pixel region PX in a target photodiode array region DM has a photodiode PD in a surface region of a first main surface 1$a$ of the semiconductor substrate 1$s$. The semiconductor substrate 1$s$ has, on the first main surface 1$a$ thereof, an interlayer insulating film 11 having a multilayer wiring MW (embedded wiring or non-embedded wiring, or combination thereof). This interlayer insulating film 11 has a waveguide holding hole 9 having a substantially vertical sidewall 9$s$ (a sidewall having an internal angle $\theta$ of substantially 90°) (the waveguide holding hole 9 may have a bottom in the middle of the interlayer insulating film 11 or it may penetrate therethrough; and it may have or may not have an anti-reflective film AR). In the waveguide holding hole 9, a waveguide 10 having a multilayer structure is embedded. The waveguide 10 has the following internal structure. Described specifically, the waveguide holding hole 9 has, at the periphery thereof, a silicon oxide-based sidewall insulating film 19 (which is not essential, but preferably surrounds the whole circumference) covering the side surface 9$s$ of the waveguide holding hole 9 and reaching a bottom surface 9$b$ thereof. It has, inside the silicon oxide-based sidewall insulating film 19, a first silicon nitride-based insulating film 20$a$ covering the surface thereof and the bottom surface 9$b$ of the waveguide holding hole 9. It further has, inside the first silicon nitride-based insulating film 20$a$, a second silicon nitride-based insulating film 20$b$ covering the surface thereof and having a refractive index higher than that of the first silicon nitride-based insulating film 20$a$. It has still further, on the second silicon nitride-based insulating film 20$b$, a third silicon nitride-based insulating film 20$c$ having a refractive index higher than that of the second silicon nitride-based insulating film 20$b$ so as to fill the waveguide holding hole 9 (complete filling is not essential but preferred in this case).

Such structures offer following advantages corresponding to the characteristics of the respective structures.

(2-1) The sidewall 9$s$ of the waveguide holding hole 9 which is substantially vertical is advantageous for miniaturization of the pixel region PX. In addition, it can be obtained by relatively simple processing.

(2-2) The silicon oxide-based sidewall insulating film 19 at an outer portion in the waveguide 10 can reduce scattering of a signal light due to the influence of a multilayer film outside the sidewall 9$s$.

(2-3) The structure of the waveguide 10 in which a refractive index increases toward the center portion from the outer portion enables focusing of a signal light on the center portion of the photodiode PD.

(2-4) Since the silicon oxide-based sidewall insulating film 19 lies as an outer portion of the waveguide 10, the multilayer film (the first silicon nitride-based insulating film 20$a$ and the second silicon nitride-based insulating film 20$b$) inside the waveguide 10 inclines toward the center side, which makes the velocity of a signal light traveling obliquely through this multilayer film higher than the velocity of a signal light traveling straight through the center. As a result, the overall wavefront does not curve and scattering can be suppressed.

(2-5) A gradual change in refractive index occurs because the waveguide 10 has, at the lower portion thereof, a multilayer film structure. This reduces reflection or the like at the interface.

(2-6) The waveguide 10 is comprised basically of the silicon oxide-based insulating film and the silicon nitride-based insulating film so that it can be manufactured relatively easily.

(2-7) Since the waveguide holding hole has only one sidewall, it can be manufactured relatively easily.

(2-8) In this example, the position of the lower end of the waveguide holding hole 9 is not limited, but the lower end in the middle of the interlayer insulating film 11 is advantageous from the standpoint of preventing damage to the substrate. When the anti-reflective film AR is below the waveguide holding hole 9, the waveguide holding hole 9 having a lower end on the upper surface of the anti-reflective film AR is advantageous in process because etching can be terminated there.

(3) Description on Other Modification Examples (Including a Color-by-Color Nitride Multilayer Film Thickness Adjustment Type Structure)

The following modification examples can be used in combination with all the examples (including the basic example and modification example) described above.

(3-1) Description on a Color-by-Color Anti-Reflective Film Optimization System (Refer to FIG. 12 and the Like)

In the examples described above, the pixel regions PX are, when viewed microscopically, provided adjacent to each other, divided by a color, for example, red, green, or blue color and the basic configuration (such as film configuration or film thickness) of the anti-reflective film AR of each pixel region PX is the same (same anti-reflective film system). It is however not essential to employ such a system and the film configuration, film thickness, or the like may be optimized with respect to each pixel region PX corresponding to each color (color-by-color anti-reflective film optimization system). According to this color-by-color anti-reflective film optimization system, reflection in each color can be reduced. The same anti-reflective film system has, on the other hand, the advantage that it simplifies the process.

(3-2) Description on Color-by-Color Waveguide Structure Changing System (Refer to FIGS. 7, 25, 27, and 30.)

In the examples described above, the pixel regions PX have the same waveguide structure whatever color they correspond to (same waveguide structure system). It is not essential to employ this system and the waveguide structure may be changed by color (waveguide structure combination system). For example, it is possible to use the waveguide shown in FIG. 25 as the waveguide 10 of a pixel region PX corresponding to red and green colors and the waveguide shown in FIG. 30 as the waveguide 10 of a pixel region PX corresponding to a blue color. Such a waveguide structure combination system enables optimization of the waveguide 10 by color, while the same waveguide structure system has the advantage that it facilitates the manufacturing process.

(3-3) A Structure of an Embedded Nitrogen Silicon Nitride-Based Insulating Film with a Convex Thereon (Refer to FIGS. 7, 25, 27, and 30)

In the examples described above, the embedded silicon nitride-based insulating film 20c is basically flat at the upper end of the waveguide holding hole 9 (a structure of an embedded silicon nitride-based insulating film with a flat upper surface). A flat upper surface is not essential and the film may have a convex structure thereon (a structure of an embedded silicon nitride-based insulating film with a convex thereon). This makes it possible to enhance the light focusing effect further. On the other hand, the structure of an embedded silicon nitride-based insulating film with a flat upper surface has the advantage that it facilitates the manufacturing process.

In the structure of an embedded silicon nitride-based insulating film with a flat upper surface or the structure of an embedded silicon nitride-based insulating film with a convex thereon, an anti-reflective film AR may be provided on the embedded silicon nitride-based insulating film 20c (a structure of an embedded silicon nitride-based insulating film with an anti-reflective film thereon). Such a structure makes it possible to reduce reflection at the upper end portion of the waveguide 10. The structure of an embedded silicon nitride-based insulating film with a flat upper surface has, on the other hand, the advantage that it facilitates the manufacturing process.

(3-4) Description on a Modification Example with Respect to an Intermediate Multilayer Structure in Waveguide (Refer to FIGS. 7, 25, 27, and 30)

As the intermediate multilayer structure in the waveguide such as the first silicon nitride-based insulating film 20a (first silicon nitride-based sidewall insulating film 30a) and the second silicon nitride-based insulating film 20b (second silicon nitride-based sidewall insulating film 30b) shown in FIGS. 7, 25, 27, and 30, examples each comprised of two layers was described specifically. It is needless to say that such an intermediate layer structure is not essential and it may be comprised of a single layer or three or more layers. The intermediate layer structure comprised of a single layer has the advantage that it facilitates a manufacturing process. The intermediate layer structure comprised of three or more layers has, on the other hand, an effect close to that produced by continuous distribution as in FIG. 24.

12. Summary

The invention made by the present inventors was described specifically based on some embodiments. The invention is however not limited to or by them but can be changed in various ways without departing from the scope of the invention.

For example, in the above-mentioned embodiments, a multilayer wiring using mainly a copper-based embedded wiring was described specifically as an example, but it is needless to say that a multilayer wiring using an embedded wiring other than copper-based one or a non-embedded wiring such as aluminum-based one may be used.

In the above-mentioned embodiment, a semiconductor integrated circuit device having mainly a CMOS image sensor region as an image sensor region was described specifically as an example, but it is needless to say that the image sensor region is not limited to a CMOS image sensor region but an image sensor region of another system such as CCD image sensor region is also usable.

Further, in the above-mentioned embodiment, a semiconductor chip having both an image sensor region and another circuit region was described specifically as an example, but it is needless to say that most of the entirety of a semiconductor chip may be occupied by an image sensor region.

In the above-mentioned embodiment, a semiconductor integrated circuit device using a silicon-based semiconductor substrate (including a SiGe substrate or a SOI substrate) was described as an example, but it is needless to say that the device may use another semiconductor substrate (for example, a GaAs substrate) or another insulating substrate.

What is claimed is:

1. A semiconductor integrated circuit device including a CMOS image sensor, comprising:
    a photodiode formed in a semiconductor substrate and configuring a part of the CMOS image sensor;
    an interlayer insulating film formed over the photodiode;
    a waveguide holding hole formed in the interlayer insulating film above the photodiode;
    a first silicon nitride-based insulating film being a sidewall shape and formed over a side surface and an edge of a hole bottom surface of the waveguide holding hole;
    a second silicon nitride-based insulating film being a sidewall shape and formed along the first silicon nitride-based insulating film; and
    a third silicon nitride-based insulating film formed along the second silicon nitride-based insulating film and covering the hole bottom surface,
    wherein the waveguide holding hole is embedded by the first, second and third silicon nitride-based insulating films,
    wherein the second silicon nitride-based insulating film has a refractive index higher than that of the first silicon nitride-based insulating film, and
    wherein the third silicon nitride-based insulating film has a refractive index higher than that of the second silicon nitride-based insulating film.

2. A semiconductor integrated circuit device according to the claim 1,
    wherein a taper angle of the upper portion of the boundary surface between the first silicon nitride-based insulating film and the second silicon nitride-based insulating film is smaller than a taper angle of the lower portion thereof, and
    wherein a taper angle of the upper portion of the boundary surface between the second silicon nitride-based insulating film and the third silicon nitride-based insulating film is smaller than a taper angle of the lower portion thereof.

3. A semiconductor integrated circuit device according to the claim 2,
    wherein the waveguide holding hole is tapered toward the semiconductor substrate.

4. A semiconductor integrated circuit device according to the claim 1,
    wherein the waveguide holding hole is tapered toward the semiconductor substrate.

5. A semiconductor integrated circuit device according to the claim 1,
    wherein an anti-reflective film is formed between the interlayer insulating film and the photodiode.

6. A semiconductor integrated circuit device according to the claim 5,
    wherein the waveguide holding hole reaches the anti-reflective film.

7. A semiconductor integrated circuit device according to the claim 5,
    wherein the anti-reflective film includes a silicon nitride film and a silicon oxide film.

8. A semiconductor integrated circuit device including a CMOS image sensor, comprising:
    a photodiode formed in a semiconductor substrate and configuring a part of the CMOS image sensor;
    an interlayer insulating film formed over the photodiode;
    a waveguide holding hole formed in the interlayer insulating film above the photodiode;
    a silicon oxide-based sidewall insulating film formed over a side surface and an edge of a hole bottom surface of the waveguide holding hole;
    a first silicon nitride-based insulating film being a sidewall shape and formed along the silicon oxide-based sidewall insulating film;
    a second silicon nitride-based insulating film being a sidewall shape and formed along the first silicon nitride-based insulating film; and
    a third silicon nitride-based insulating film formed along the second silicon nitride-based insulating film and covering the hole bottom surface,
    wherein the waveguide holding hole is embedded by the silicon oxide-based sidewall insulating film and the first, second and third silicon nitride-based insulating films,
    wherein the second silicon nitride-based insulating film has a refractive index higher than that of the first silicon nitride-based insulating film, and
    wherein the third silicon nitride-based insulating film has a refractive index higher than that of the second silicon nitride-based insulating film.

9. A semiconductor integrated circuit device according to the claim 8,
    wherein a taper angle of the upper portion of the boundary surface between the first silicon nitride-based insulating film and the second silicon nitride-based insulating film is smaller than a taper angle of the lower portion thereof, and
    wherein a taper angle of the upper portion of the boundary surface between the second silicon nitride-based insulating film and the third silicon nitride-based insulating film is smaller than a taper angle of the lower portion thereof.

10. A semiconductor integrated circuit device according to the claim 8,
    wherein an anti-reflective film is formed between the interlayer insulating film and the photodiode.

11. A semiconductor integrated circuit device according to the claim 10,
    wherein the waveguide holding hole reaches the anti-reflective film.

12. A semiconductor integrated circuit device according to the claim 10,
    wherein the anti-reflective film includes a silicon nitride film and a silicon oxide film.

13. A semiconductor integrated circuit device according to the claim 1,
    wherein a part of the hole bottom surface is exposed from the first and second silicon nitride-based insulating films, and
    wherein the part of the hole bottom surface is covered with the third silicon nitride-based insulating film.

14. A semiconductor integrated circuit device according to the claim 8,
    wherein a part of the hole bottom surface is exposed from the silicon oxide-based sidewall insulating film and the first and second silicon nitride-based insulating films, and
    wherein the part of the hole bottom surface is covered with the third silicon nitride-based insulating film.

* * * * *